United States Patent
Chen et al.

(10) Patent No.: US 11,271,348 B1
(45) Date of Patent: Mar. 8, 2022

(54) HIGH PERFORMANCE ELECTRICAL CONNECTOR

(71) Applicant: Amphenol Corporation, Wallingford, CT (US)

(72) Inventors: Xingye Chen, Markham (CA); Jason Si, Toronto (CA)

(73) Assignee: Amphenol Corporation, Wallingford, CT (US)

( * ) Notice: Subject to any disclaimer, the term of this patent is extended or adjusted under 35 U.S.C. 154(b) by 0 days.

(21) Appl. No.: 16/663,189

(22) Filed: Oct. 24, 2019

Related U.S. Application Data

(60) Provisional application No. 62/750,190, filed on Oct. 24, 2018, provisional application No. 62/750,179, filed on Oct. 24, 2018.

(51) Int. Cl.
| | |
|---|---|
| *H01R 13/6587* | (2011.01) |
| *H01R 12/58* | (2011.01) |
| *H01R 12/72* | (2011.01) |
| *H01R 12/73* | (2011.01) |
| *H04B 10/40* | (2013.01) |

(Continued)

(52) U.S. Cl.
CPC ....... *H01R 13/6587* (2013.01); *H01R 12/585* (2013.01); *H01R 12/724* (2013.01); *H01R 12/737* (2013.01); *H01R 13/514* (2013.01); *H01R 13/6471* (2013.01);
(Continued)

(58) Field of Classification Search
CPC ............ H01R 13/6587; H01R 13/6595; H01R 13/6594; H01R 12/585; H01R 12/724; H01R 12/737; H01R 13/514; H01R 13/6471; H05K 7/20154; H05K 7/20418;
(Continued)

(56) References Cited

U.S. PATENT DOCUMENTS

| | | | | |
|---|---|---|---|---|
| 5,089,936 | A | * | 2/1992 Kojima | H01L 23/4006 257/697 |
| 5,101,322 | A | * | 3/1992 Ghaem | H05K 7/20854 333/185 |

(Continued)

OTHER PUBLICATIONS

[No Author Listed], INF-8438i Specification for QSFP (Quad Small Formfactor Pluggable) Transceiver. Rev 1.0. Nov. 2006. SFF Committee. 75 pages.

(Continued)

*Primary Examiner* — Marcus E Harcum
(74) *Attorney, Agent, or Firm* — Wolf, Greenfield & Sacks, P.C.

(57) ABSTRACT

A high performance connector that provides heat dissipation sufficient to support operation of high power consuming QSFP-DD transceivers. The connector may be housed in a cage with a first channel to receive a transceiver. A connector port may be aligned with the first channel, and a heat transfer element comprising a compressible portion may make mechanical and thermal contact with a transceiver inside the first channel. The compressible portion may be urged to contact a transceiver by a biasing element. The heat transfer element may be thermally coupled to a heat dissipating element outside the cage. The cage may have multiple channels, and the heat transfer element may be installed in a channel between other channels, each receiving transceivers such that the heat transfer element may receive heat from multiple transceivers.

19 Claims, 21 Drawing Sheets

(51) Int. Cl.
 *H01R 13/6471* (2011.01)
 *H05K 7/20* (2006.01)
 *H01R 13/514* (2006.01)

(52) U.S. Cl.
 CPC ......... *H04B 10/40* (2013.01); *H05K 7/20154* (2013.01); *H05K 7/20418* (2013.01)

(58) Field of Classification Search
 CPC ... H05K 7/20481; G02B 6/4272; H04B 10/40
 USPC ................................ 439/485, 607.2, 607.22
 See application file for complete search history.

(56) References Cited

U.S. PATENT DOCUMENTS

| | | | | |
|---|---|---|---|---|
| 6,490,161 | B1* | 12/2002 | Johnson | H01L 23/4006 361/704 |
| 6,517,382 | B2 | 2/2003 | Flickinger et al. | |
| 6,749,448 | B2 | 6/2004 | Bright et al. | |
| 6,811,326 | B2 | 11/2004 | Keeble et al. | |
| 6,816,376 | B2 | 11/2004 | Bright et al. | |
| 7,260,303 | B2* | 8/2007 | Bench | G02B 6/4201 385/134 |
| 7,385,812 | B1* | 6/2008 | Konshak | G11B 33/0438 361/690 |
| 7,484,552 | B2* | 2/2009 | Pfahnl | F28D 1/0535 165/104.33 |
| 7,575,471 | B2* | 8/2009 | Long | G02B 6/0001 439/541.5 |
| 7,780,361 | B2* | 8/2010 | Harris | G02B 6/4266 385/92 |
| 8,083,547 | B2* | 12/2011 | Roth | H01R 13/62938 439/607.23 |
| 8,469,738 | B2 | 6/2013 | Long | |
| 8,968,867 | B2* | 3/2015 | Min | H01L 23/38 428/343 |
| 9,389,368 | B1 | 7/2016 | Sharf | |
| 9,509,102 | B2 | 11/2016 | Sharf et al. | |
| 9,518,785 | B2* | 12/2016 | Szczesny | G02B 6/4261 |
| 9,653,829 | B2 | 5/2017 | Long | |
| 9,668,378 | B2* | 5/2017 | Phillips | H05K 7/20418 |
| 9,761,974 | B2* | 9/2017 | L'Esperance | G02B 6/4268 |
| 10,153,571 | B2 | 12/2018 | Kachlic | |
| 10,367,283 | B2 | 7/2019 | L'Esperance et al. | |
| 10,446,960 | B2* | 10/2019 | Guy Ritter | H01R 13/6587 |
| 10,551,580 | B2 | 2/2020 | Regnier et al. | |
| 10,555,437 | B2* | 2/2020 | Little | H01R 13/518 |
| 10,588,243 | B2* | 3/2020 | Little | H01R 24/60 |
| 10,651,598 | B2* | 5/2020 | Chen | H05K 7/20481 |
| 10,797,417 | B2* | 10/2020 | Scholeno | H05K 7/20145 |
| 10,873,149 | B2* | 12/2020 | Chen | H05K 7/20154 |
| 2005/0190540 | A1* | 9/2005 | Shearman | H05K 7/1461 361/715 |
| 2006/0060328 | A1* | 3/2006 | Ewes | H01L 23/427 165/80.2 |
| 2008/0232067 | A1* | 9/2008 | Joiner | H05K 7/20445 361/707 |
| 2012/0003848 | A1 | 1/2012 | Casher et al. | |
| 2012/0058670 | A1* | 3/2012 | Regnier | H01R 12/00 439/485 |
| 2012/0099275 | A1* | 4/2012 | Regnier | H05K 7/20709 361/690 |
| 2014/0187058 | A1* | 7/2014 | Yan | H05K 7/20436 439/55 |
| 2014/0321061 | A1* | 10/2014 | Moore | H05K 9/0058 361/709 |
| 2015/0087180 | A1* | 3/2015 | Wu | G02B 6/4269 439/485 |
| 2016/0211623 | A1* | 7/2016 | Sharf | G02B 6/4269 |
| 2017/0023751 | A1* | 1/2017 | Steijer | G02B 6/4259 |
| 2017/0054234 | A1* | 2/2017 | Kachlic | H01R 13/6594 |
| 2017/0077643 | A1* | 3/2017 | Zbinden | G02B 6/4268 |
| 2017/0285282 | A1* | 10/2017 | Regnier | G02B 6/3897 |
| 2018/0278000 | A1* | 9/2018 | Regnier | H01R 25/003 |
| 2019/0115677 | A1 | 4/2019 | Kachlic | |
| 2019/0181582 | A1* | 6/2019 | Beltran | G06F 1/20 |
| 2019/0379417 | A1* | 12/2019 | English | H05K 5/0247 |
| 2020/0091637 | A1 | 3/2020 | Scholeno et al. | |

OTHER PUBLICATIONS

[No Author Listed], INF-8628 Specification for QSFP-DD 8X Transceiver (QSFP Double Density) Rev 0.0. Jun. 27, 2016. SNIA SFF TWG Technology Affiliate. 1 page.
[No Author Listed], SFF-8663 Specification for QSFP+ 28 Gb/s Cage (Style A) Rev 1.7. Oct. 19, 2017. SNIA SFF TWG Technology Affiliate. 18 pages.
Scholeno et al., High Performance Stacked Connector, USAN U.S. Appl. No. 16/824,355, filed Mar. 19, 2020.
U.S. Appl. No. 16/569,729, filed Sep. 13, 2019, Scholeno et al.
U.S. Appl. No. 16/824,355, filed Mar. 19, 2020, Scholeno et al.

\* cited by examiner

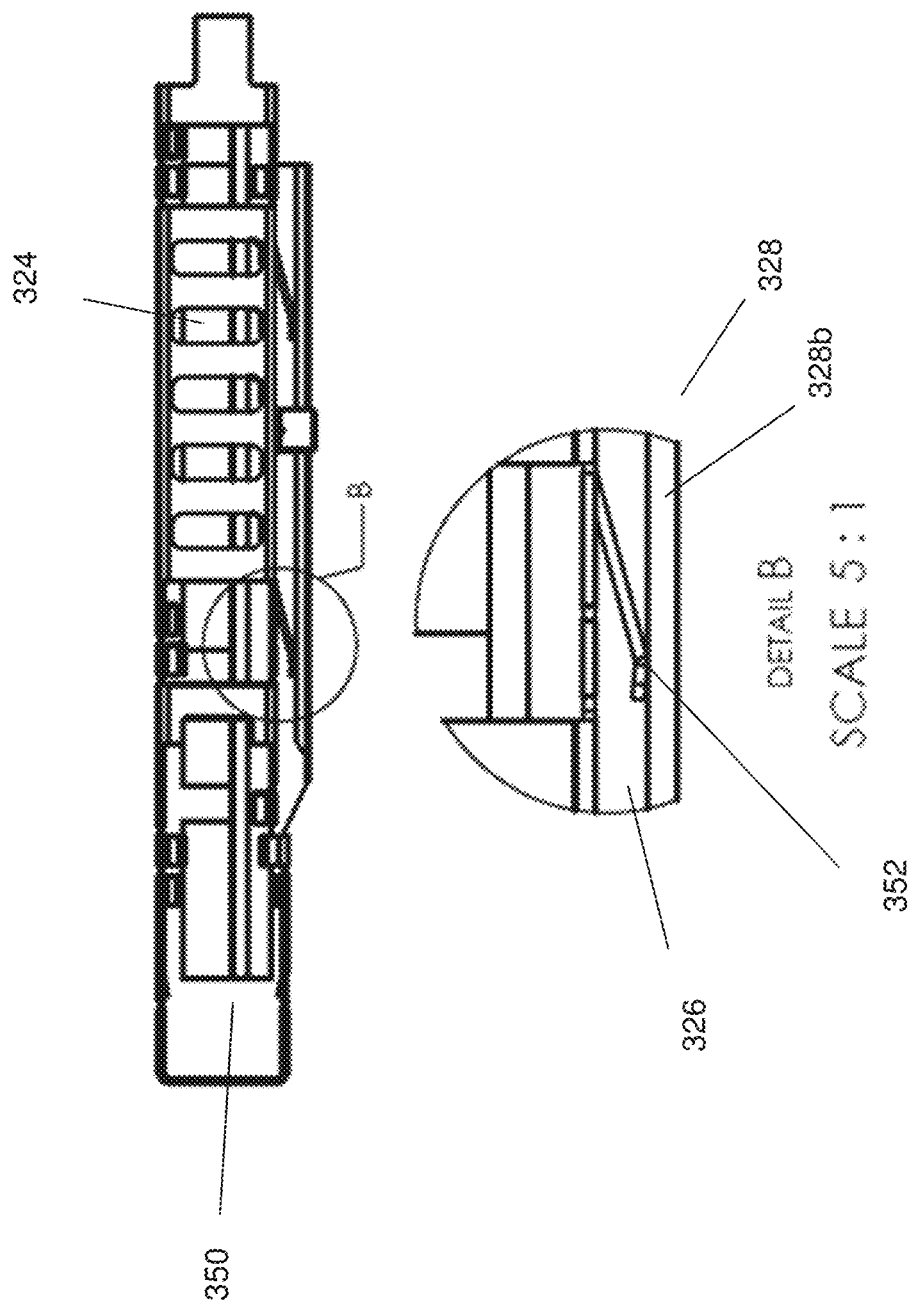

HIGH PERFORMANCE ELECTRICAL CONNECTOR

RELATED APPLICATIONS

This application claims priority under 35 U.S.C. § 119(e) to U.S. Provisional Application Ser. No. 62/750,179, titled "HIGH PERFORMANCE ELECTRICAL CONNECTOR", filed on Oct. 24, 2018, which is herein incorporated by reference in its entirety.

This application claims priority under 35 U.S.C. § 119(e) to U.S. Provisional Application Ser. No. 62/750,190, titled "HIGH PERFORMANCE ELECTRICAL CONNECTOR", filed on Oct. 24, 2018, which is herein incorporated by reference in its entirety.

BACKGROUND

An electronic system may include two or more electronic devices connected with a cable. The devices may have input/output (I/O) connectors for connecting with plug connectors terminating the ends of the cable. The cable may be constructed to carry electrical or optical signals. For transmitting optical signals, a transceiver is provided at one end of the cable for converting the optical signals to electrical signals.

The plugs and I/O connectors may be constructed according to standards that enable components from different manufacturers to mate. For example, the Quad Small Form-factor Pluggable (QSFP) standard defines a compact, hot-pluggable transceiver used for data communications applications. The form factor and electrical interface are specified by a multi-source agreement (MSA) under the auspices of the Small Form Factor (SFF) Committee.

Components made according to the QSFP standard are widely used to interface networking hardware (such as servers and switches) to fiber optic cables or active or passive electrical connections.

A QSFP plug mates with a receptacle, which is typically mounted on a printed circuit board (PCB). To block electromagnetic interference (EMI), the receptacle may be located within a metal cage also mounted to the PCB. The receptacle is typically set back from the edge of the PCB and located at the back portion of the cage. The front portion of the cage usually extends through a panel of an electronic device and has an opening for receiving the QSFP transceiver. A channel extends from the opening at the front portion of the cage toward the rear portion to guide the transceiver into engagement with the receptacle. Such an arrangement may be used to connect a circuit board inside an electronic device to an external device using a cable.

A transceiver for converting optical signals to electrical signals may consume significant power, and therefore generate a significant amount of heat. A QSFP transceiver might consume 12 Watts (W), for example. Transceivers that process more signals, such as transceivers made according to a QSFP-DD standard, may consume up to 15 W. Large amounts of heat may cause the temperature around electronic, optical, or other components to exceed their rated operating temperature, contributing to errors during operation or reducing the lifetime of the components. Heat generated by a transceiver may be dissipated through the use of a cooling fan that flows air over the metal cage. Heat sinks may be mounted to the outside of the cage to further dissipate heat from the transceiver.

In some systems, two or more transceivers are disposed in close proximity to each other. I/O connectors may be configured in a "stacked" configuration to support use of multiple transceivers. For example, an upper transceiver and lower transceiver may be positioned within one cage to make a double stacked connector. In some systems, two or more transceivers may be disposed adjacent to each other, in addition to or instead of stacking transceivers.

SUMMARY

In one aspect, the invention relates to an apparatus. The apparatus comprises a cage comprising a first channel comprising a first opening configured to receive a transceiver, a connector comprising a port aligned with the first channel, and a heat transfer element comprising a compressible portion configured to make mechanical and thermal contact with a transceiver inside the first channel.

In one aspect, the invention relates to an electronic system. The electronic system comprises an enclosure having a panel with at least one opening therethrough, a printed circuit board within the enclosure, and a cage mounted to the printed circuit board. The cage comprises a first channel and a second channel and a third channel. The first channel is adjacent the printed circuit board. The first channel and the third channel have ends exposed in the opening. The second channel is disposed between the first channel and the third channel. The electronic system comprises a connector, wherein the connector comprises a first port aligned with the first channel and second port aligned with the third channel, a heat transfer element disposed at least partially within the second channel and configured to transfer heat from inside the cage to outside the cage, and a heat dissipating element disposed outside the cage and thermally coupled to the heat transfer element.

In another aspect, the invention relates to a method of operating an electronic system in an ambient environment of 25 degrees C. The electronic system comprises, within an enclosure, a cage comprising a plurality of walls configured to form a first channel. The method comprises transmitting or receiving optical signals with a transceiver disposed within the first channel consuming between 10 and 16 W, contacting the transceiver by a heat transfer element, transferring heat from inside the cage to outside the cage by the heat transfer element, and dissipating heat from a heat dissipating element thermally coupled to the heat transfer element, thereby dissipating heat from the transceiver in the first channel such that a temperature rise of the transceiver relative to an off state of the transceiver is less than 25 degrees C.

In one aspect, the invention relates to a cage for an I/O connector. The cage comprises a first channel, a second channel adjacent the first channel, a third channel adjacent the second channel wherein the second channel is disposed between the first channel and the third channel, and a spring member positioned with respect to the second channel so as to urge at least a portion of a heat transfer element disposed within the second channel towards the first channel.

The foregoing is a non-limiting summary of the invention, which is defined by the appended claims.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 6C is a side view of a middle cage and associated thermal management components according to some embodiments;

FIG. 6D is a detail view of the middle cage and associated thermal management components according to some embodiments of FIG. 6C;

DETAILED DESCRIPTION

Figure 1:
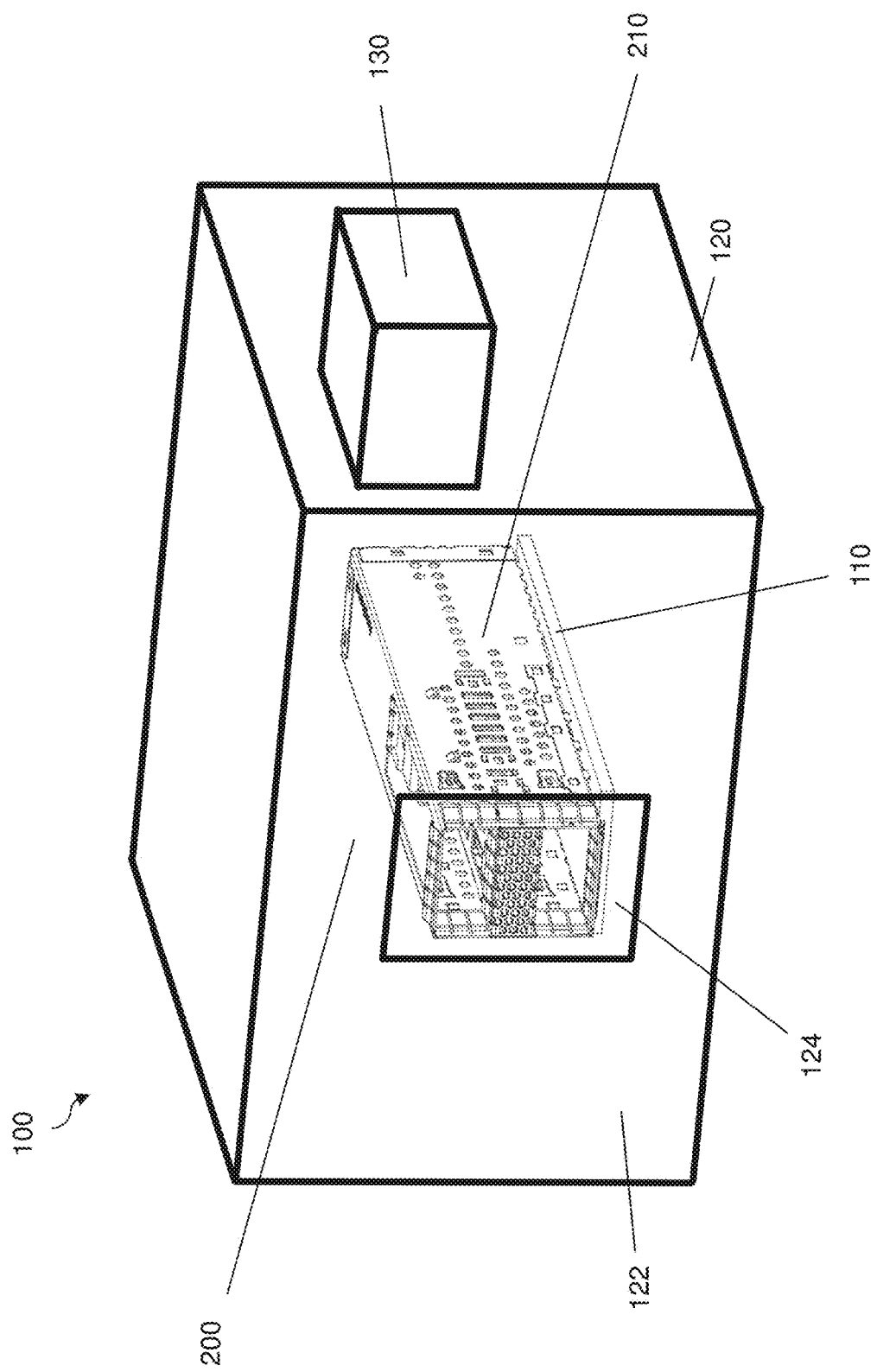
FIG. 1 is a front-right perspective view of an electronic system according to some embodiments.

The inventors have recognized and appreciated designs that enable an increased density of I/O connections. The inventors have recognized and appreciated that an increased density of I/O connections may be enabled with improved heat dissipation from I/O connectors. Increased density may arise from transceivers that process more signals in the same space, such as may arise in transceivers compliant with the QSFP-DD standard. Additionally, increased density may result from "stacking" connectors, which results in transceivers one above the other with only a small space between them. The inventors have further recognized and appreciated techniques to provide improved heat dissipation even for stacked or other high density connectors. These techniques may be used in connection with components compliant with QSFP standards.

Such techniques may enable an increased rate of heat transfer from inside the cage to outside the cage. In accordance with embodiments of the present application, an increased rate of heat transfer may be enabled even for connectors or transceivers of an increased density and/or increased power consumption.

In some embodiments, there may be an assembly including an electrical connector. In some embodiments, the assembly may at least partially enclose a connector. The connector may include one or more ports each configured to receive a transceiver. The transceivers may be optical transceivers configured to convert optical signals into electrical signals or vice-versa. The assembly may include a cage. In some embodiments, the cage may at least partially enclose the connector. The cage may include a first channel configured to receive a transceiver and/or guide a transceiver to connect with a port of the connector. The assembly may further include an element configured to transfer heat, which may be disposed at least partially within the cage. The assembly may further include a heat dissipating element, which may be disposed at least partially outside the cage.

In a stacked connector, for example, there may be a cage for electrical connectors that includes a first, second, and third channel where the second channel is between the first and third channel. In such a configuration, the connector and cage may provide a double stacked configuration, providing an I/O connector that can receive two transceivers, one above the other. The first channel and third channel may each be capable of receiving an optical or other type of transceiver. The transceiver may be a QSFP transceiver or a QSFP-DD transceiver, for example. In this regard, the first channel and/or the third channel may be compliant with QSFP or QSFP-DD standards. In some embodiments, a first channel may be arranged side by side with a second channel. Such an embodiment may or may not include a second channel between the first channel and the third channel. In some embodiments, channels may be arranged in an array to achieve a high density of connectors, for example an M by N array. In some embodiments M may be two, such that the array is stacked two connectors high. N connectors may be arranged side by side with each other. In various embodiments, N may be 2 or more, 5 or more, or any other suitable number.

The heat transfer element may be configured to transfer heat from inside the cage to outside the cage. In some embodiments, the cage may include a second channel adjacent the first channel. The heat transfer element may be disposed within the second channel. In some embodiments, the heat transfer element may be arranged through an opening in the cage, and may not be disposed in a channel of the cage. In some embodiments, the heat transfer element may be configured such that it has a portion that extends into the first channel and will contact a transceiver when the transceiver is disposed within the first channel. In some embodiments, the heat transfer element may be thermally coupled to a transceiver disposed in the first channel.

In some embodiments, a heat transfer element may be a passive heat transfer element. In some embodiments, a heat transfer element may transfer heat primarily through conduction. Alternatively, or additionally, heat may be transferred by boiling a fluid such that the resulting gas can flow to another location and release heat as it condenses. As an example, the heat transfer element may include a heat pipe.

In some embodiments, active heat transfer may be employed. A heat transfer element, for example, may transfer heat by movement of fluids. Flowing cooling water, for example, may transfer heat. In some embodiments, an active heat transfer element may transfer heat without moving parts. As an example, a heat transfer element may be a solid state heat transfer element, such as a Pelletier junction device.

The heat transfer element may have a compressible portion. For example, the heat transfer element may comprise various thermal interface materials attached to the heat transfer element. In some embodiments, thermal interface materials may be compressible. The compressible portion may be compressible from a first thickness to a second thickness, providing "travel" equal to the difference between the first thickness and the second thickness. That travel, in operation, may be up to 10%, 15%, 20%, or 25% in some embodiments. The heat transfer element may be mounted within the cage to make mechanical and thermal contact with another component compressing the thermal interface up to the travel distance. So long as the body of the heat transfer element, to which the compressible portion is attached, is positioned within the travel distance of the other component, the heat transfer element contacts the other component for heat transfer.

The compressible portion of a heat transfer element may be configured such that, when a removable transceiver is inserted into a channel of the cage, the heat transfer element contacts the transceiver. A compressible portion may be configured to contact the transceiver. A compressible portion may have a high thermal conductivity. In some embodiments, the compressible portion may be biased into an adjacent channel by a biasing element such as a spring or a clip.

The heat transfer element may be thermally coupled to a heat dissipating element, which may be located outside the cage. In some embodiments the heat dissipating element may include a heat sink feature, such as a fin. The heat sink feature may be configured to increase heat transfer from the heat dissipating element when air is flowed over the heat sink feature. In some embodiments, the heat dissipating element may include a cold plate or be coupled to a cold plate.

In some embodiments, air may be flowed over or through the cage to transfer heat from inside the cage. In some embodiments, air may be flowed through an opening in the second channel of the cage. The techniques described according to a heat transfer element and a heat dissipating element may be used instead of or in combination with air flowed over or through the cage. In embodiments where a heat dissipating element which is a heat sink is provided, air may be flowed over the heat dissipating element by a fan.

In an electronic system, the heat transfer element and the heat dissipating element may allow heat to be dissipated more effectively than a configuration without these features, particularly for electronic systems which include double stacked transceivers, and/or connectors arranged side by side.

In the embodiment shown in FIG. 1, an electronic system 100 includes an enclosure 120. The enclosure has a first surface and a second surface opposite the first surface, and offset from the first surface along a first direction. As illustrated, the first surface is defined by panel 122, which has at least one opening 124 therethrough.

Electronic system 100 includes a circuit board 110 within the enclosure 120. The circuit board may be a printed circuit board (PCB). An electronic system 100 may also include an assembly 200 including an electrical connector.

In the illustrated embodiment of FIG. 1, assembly 200 includes a cage 210 which is mounted to the circuit board 110. Electronic system 100 may include any of the assemblies described herein. An end of cage 210 may be exposed in opening 124 of the enclosure, as depicted in FIG. 1. Cage 210 may enclose a connector including a first port and mounted to the printed circuit board 110. In the illustrated embodiment of FIG. 1, the connector (not pictured) is disposed within the cage. The electronic system 100 may also include a fan 130.

In some embodiments, cage 210 may be configured to provide shielding from electromagnetic interference. Cage 210 may be formed from any suitable metal or other conductive material and connected to ground for shielding against EMI using techniques known to one of skill in the art. The cage 210 may be formed from sheet metal bent into a suitable shape. However, some or all of the components of the cage 210 may be made of other materials, such as die cast metal.

Figure 2:
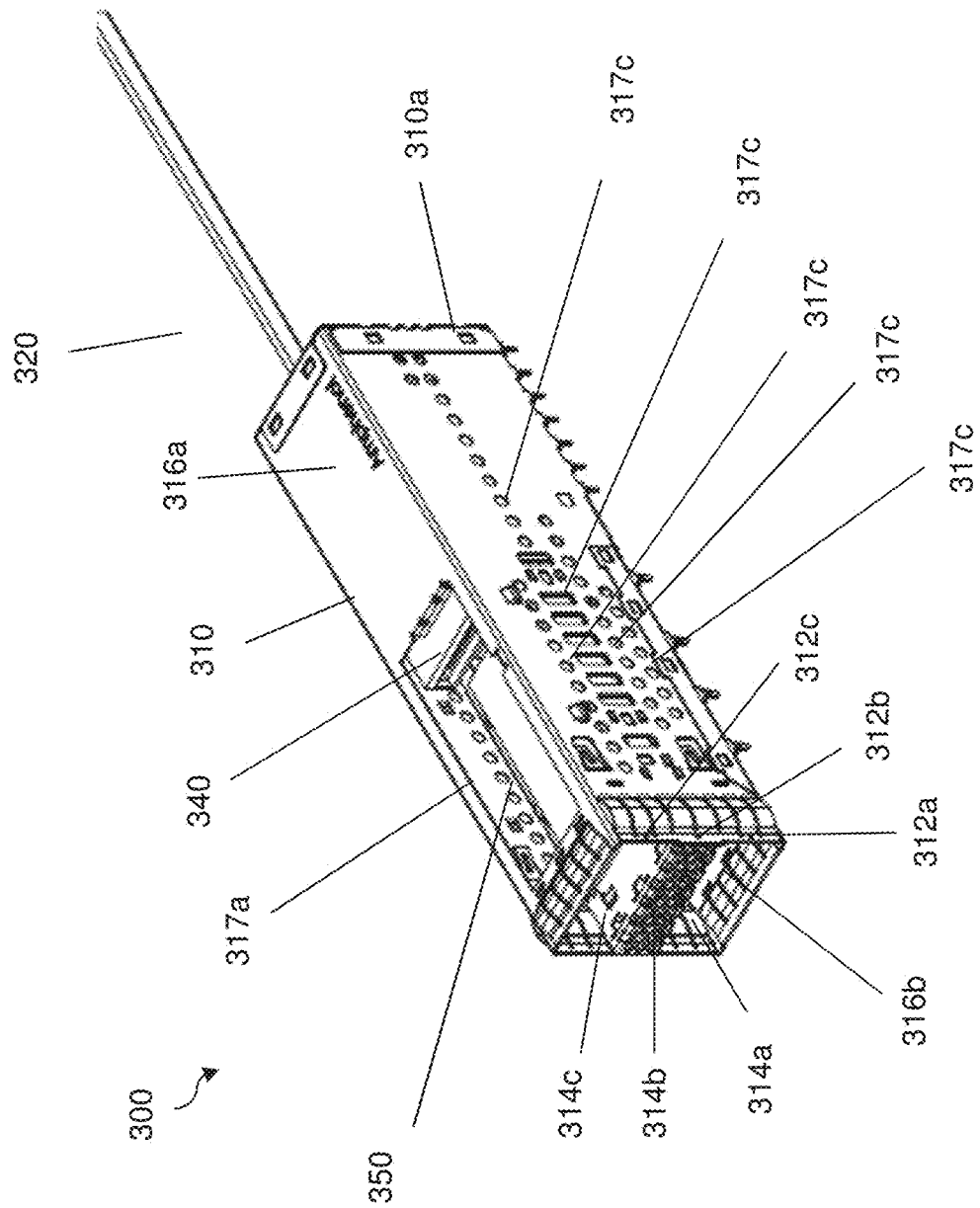
FIG. 2 is a front-right perspective view of an assembly including an electrical connector according to some embodiments.
Figure 3:
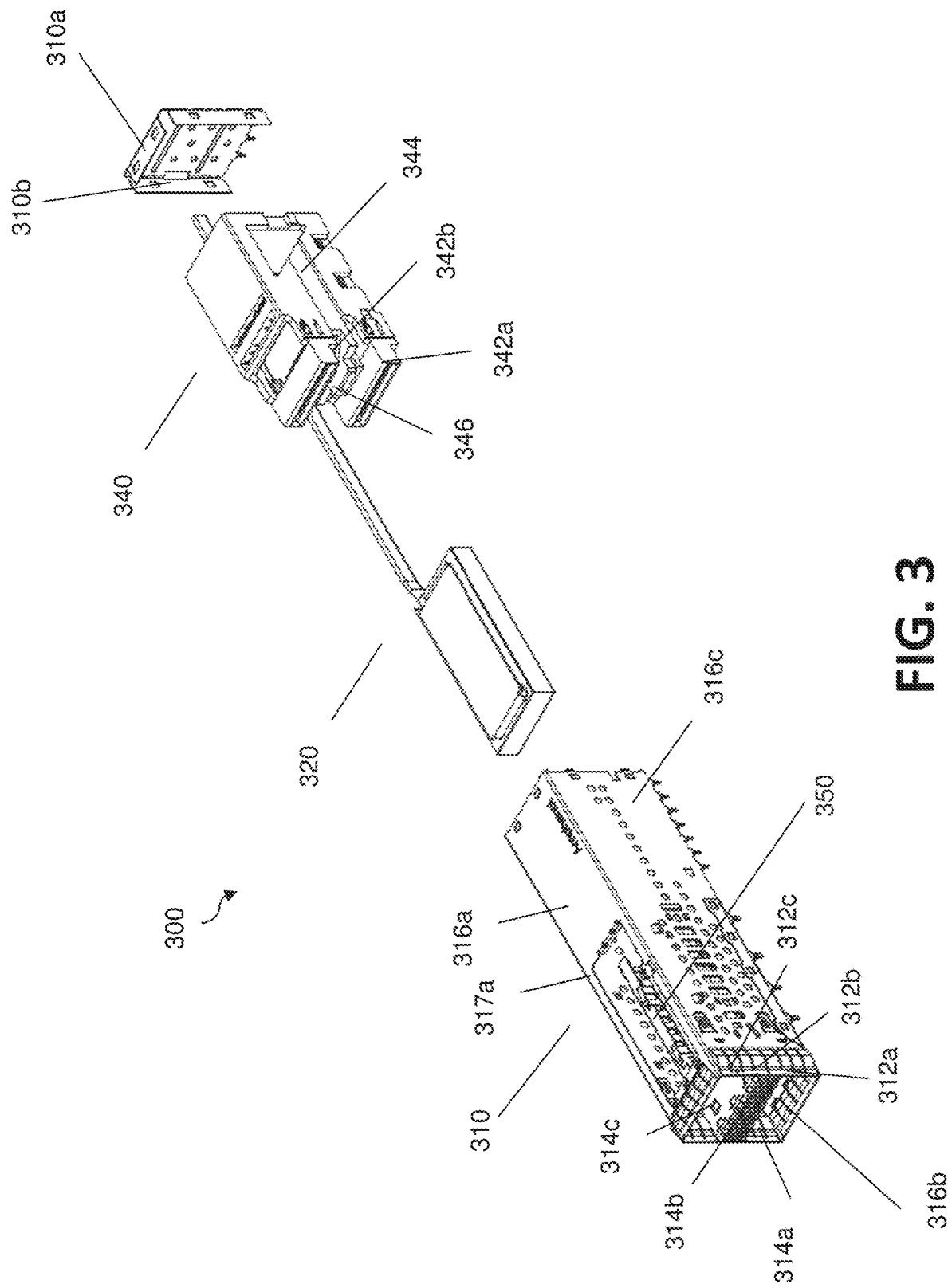
FIG. 3 is a front-right exploded perspective view of an assembly including an electrical connector according to some embodiments.

FIG. 2 shows a perspective view and FIG. 3 shows an exploded perspective view of an illustrative embodiment of an assembly to including an electrical connector. In the illustrative embodiment of FIG. 2, assembly 300 includes an electrical connector. The assembly may house a connector, such as by at least partially enclosing the connector as illustrated. The assembly 300 includes a cage 310. The cage may be formed from sheet metal, for example. The cage 310 may include a rear portion 310a. In the illustrative embodiment, the assembly 300 further includes connector 340. Assembly 300 includes a heat transfer element 320. In the illustrative embodiment, the assembly 300 includes a middle cage 350, however, the assembly may alternatively include middle cage 1350, both of which are described below.

The cage 310 may at least partially enclose a connector 340 including a plurality of ports. In the illustrated embodiment of FIG. 3, the connector 340 is a dual port connector with a first port 342a and a second port 342b. However, techniques as described herein may be used with connectors of any desired number of ports, including a single port or more than two ports.

The cage 310 may include one or more channels sized and shaped to receive a transceiver that will plug into a connector port positioned at an end of the channel. The cage 310 may also include one or more channels configured to enable heat transfer and/or dissipation from the cage. In some embodiments, heat may be dissipated from the cage at least partially by air flow through a channel adjacent another channel receiving a transceiver. As shown in FIG. 3, the cage 310 may include a first channel 312a, a second channel 312b and a third channel 312b. The second channel 312b may be adjacent the first channel 312a and/or adjacent the third channel 312c. In the embodiment illustrated, the second channel 312b is between the first channel 312a and the third channel 312c. The first channel 312a may be adjacent a printed circuit board. Second channel 312b may be configured to dissipate heat preferentially from the first channel 312a, but in some embodiments alternatively or additionally may be configured to dissipate heat from third channel 312c.

The first channel 312a may include an opening 314a configured to receive a transceiver. The first port 342a may be aligned with first channel 312a. According to some embodiments, the first channel 312a may be configured to receive and/or guide a transceiver to connect to a first port 342a in order to establish connections between the transceiver and the first port 342a, which in the embodiments illustrated are electrical connections. The first channel 312a may extend in a first direction from the opening 314a to the first port 342a. In embodiments which include an enclosure, an opening 314a of the first channel 312a may be exposed in an opening of the enclosure, which may enable a transceiver to be received by the first channel from outside the enclosure.

The cage 310 may include a second channel 312b. In some embodiments, the second channel 312b may include an opening 314b which may be configured to enable air to flow into the second channel 312b. The second channel 312b may be configured to house a heat transfer element. Air flowing through the second channel 312b may flow along the first direction, which in the example of FIG. 3 is from the opening 314a towards the rear portion 310a. The opening 314b may be disposed at an end of the second channel 312b. The second channel 312b may be arranged along the first direction. In embodiments which include an enclosure, an opening 314b of the second channel 312b may be exposed in an opening of the enclosure, which may enable air to flow into the second channel from outside the enclosure. Opening 314b may include a plurality of holes, or any other suitable arrangement which allows air to flow into the second channel. The opening 314b may be configured such that the amount of electromagnetic radiation that passes through the opening does not interfere with the function of the cage to limit EMI.

In various embodiments, the second channel 312b may have a length greater than 40 millimeters (mm), less than 60 mm, or in some embodiments, between 40 and 60 mm. In some embodiments, the length of the second channel may be between 49 and 51 mm, for example, 50 mm.

The cage 310 may include a third channel 312c. The third channel 312c may include an opening 314c configured to receive a transceiver. The second port 342b may be aligned with the third channel 312c. According to some embodiments, the third channel 312c may be configured to receive and/or guide a transceiver to connect to a second port 342b in order to establish connections between the transceiver and the second port 342b, which in the embodiments illustrated are electrical connections. The third channel 312c may extend in a first direction from the opening 314c to the second port 342b. In embodiments which include an enclosure, an opening 314c of the third channel 312c may be exposed in an opening of the enclosure, which may enable a transceiver to be received by the third channel from outside the enclosure.

Each channel may have a width which is greater than 18 mm, less than 20 mm, or, in some embodiments, between 18 and 20 mm. Channel width may be between 18.65 and 18.85 mm, for example, 18.75 mm. In more dense embodiments the channels may have a width between 12 and 16 mm, or between 13 mm and 15 mm, such as 14 mm. The width of each channel may be configured equal to or greater than the width of a QSFP transceiver such that the first channel 312a and third channel 312c may each be configured to receive a QSFP transceiver.

In some embodiments, the first port 342a and second port 342b, transceivers, and other elements of the interconnection system may be configured in accordance with one or more Small Form Factor (SFF) standards, such as QSFP or QSFP-DD. Techniques as described herein may be used in connection with other high density standards or designs, including transceivers and corresponding connectors that have contact elements on a pitch of 1 mm or less, including 0.8 mm or less, such as 0.6 mm, or, in some embodiments in a range of 0.4 to 0.8 mm. However, it is to be understood that the components of the electronic connection system may configured to be compliant with one or more other industry standards or no standards at all, if desired.

In operation, heat generated by a transceiver in the first and/or third channels may be transferred to the heat transfer element in the second channel. From there, the heat may be transferred outside the cage so as to limit the temperature rise within the cage as a result of operation of the transceivers. The heat may be transferred from the heat transfer element to outside the case as a result of the flow of air through the second channel and/or using other heat transfer techniques as described herein.

The cage 310 may be bounded by conductive top walls 316a, conductive bottom walls 316b, and conductive side walls 316c. The cage 310 may include opposing conductive side walls 316c with a top wall 316a between the opposing side walls. The bottom wall 316b may serve as the bottom wall of first channel 312a. Top wall 316a may serve as the top wall for the third channel 312c.

In some embodiments, the cage 310 may further comprise a middle cage 350. The middle cage 350 may include various structures, and may be formed by partitions which are internal to the cage 310. The internal partitions may form the top and bottom walls of the first, channel 312a, the second channel 312b, and/or the third channel 312c. In some embodiments, the internal partitions bounding the middle cage may include openings, which may allow air flowing through the second channel and/or heat from a transceiver installed in the first or third channel to flow into the second channel or vice-versa.

Figure 12A:
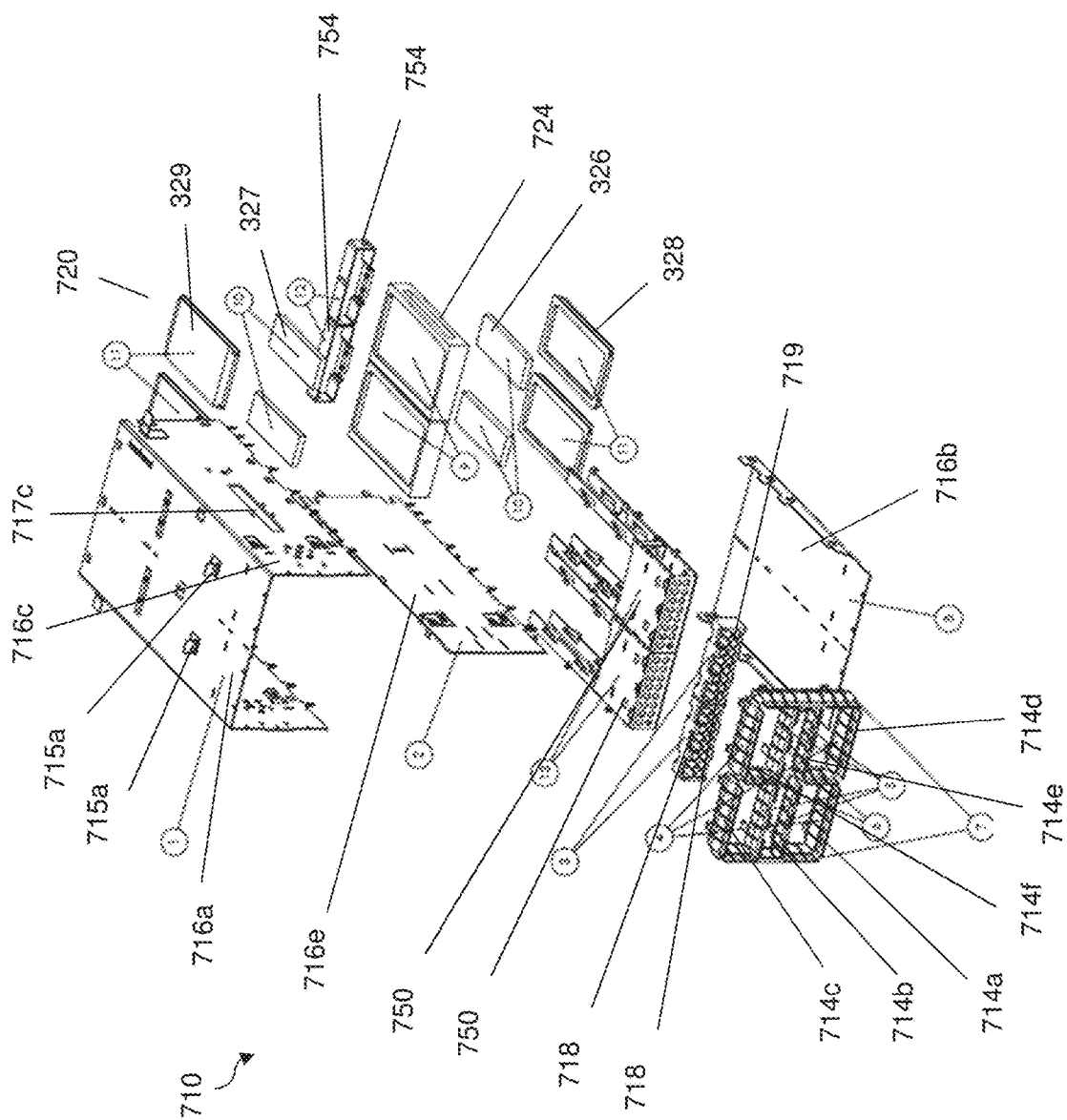
FIG. 12A is a front-right exploded perspective view of a cage with associated thermal management components according to some embodiments.

A cage may also include elements disposed in the second channel such as an EMI block shaped and positioned to block EMI passing through an end of the channel. For example, FIG. 12A shows an illustrative embodiment of a cage including an EMI block 718 (discussed below). An EMI block may be electrically conductive and grounded through contact with walls of the cage. In some embodiments, the EMI block may also be thermally conductive, and may be made of a suitable material to provide electrical and thermal conductivity, such as die cast metal. However, other materials may alternatively or additionally be used, such as electrically or magnetically lossy material, such as may be formed by filling a thermoplastic or thermosetting binder with conductive fibers or other particles. In some embodiments, the block may be configured to enable air to pass through into a second channel. The element may include at least one opening which aligns with at least one opening of a second channel and/or at least one opening of a middle cage.

Figure 16:
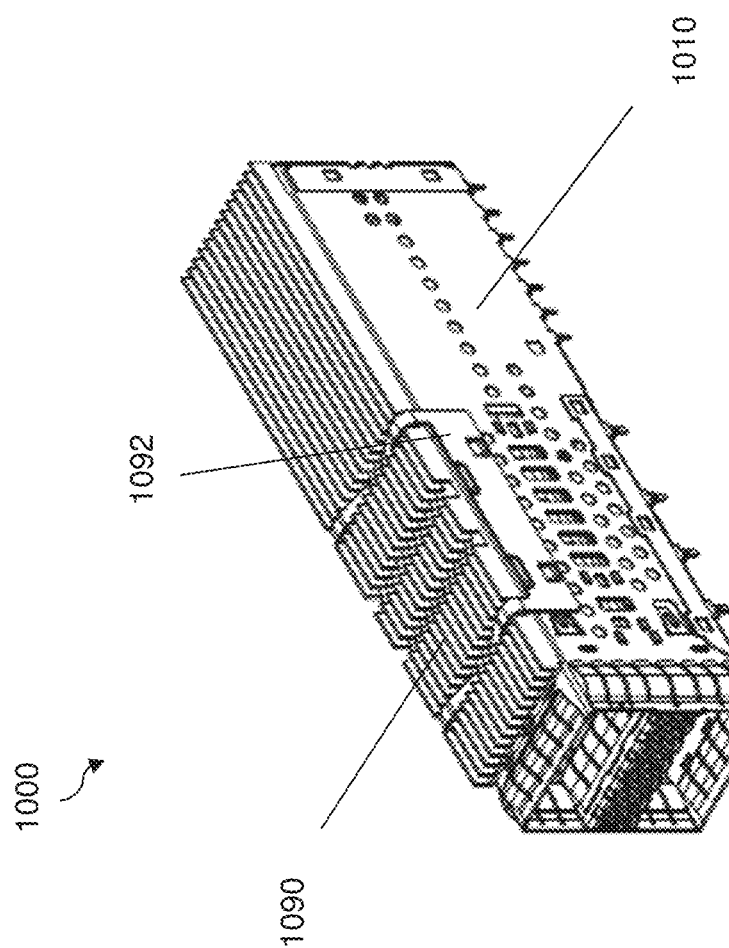
FIG. 16 is a front-right perspective view of a cage including a heat sink according to some embodiments.

One or more wall pieces may combine to provide shielding. In some embodiments, a heat sink may contribute to shielding, for example, as shown in FIG. 16 (discussed below). The first channel 312a may be separate from the third channel 312c by a distance that may be 8 mm or less. In some embodiments, the distance is measured not including the internal partitions forming the second channel; in these embodiments distance may be in the range of 5.75 to 6.25 mm, and may, for example, be 5.98 mm. In some embodiments, the distance is measured including the internal partitions forming the second channel; in these embodiments distance may be 6.48 mm. In more dense embodiments, the separation may be between 2.5 and 3.7 mm, such as between 3.0 mm and 3.4 mm or about 3.2 mm.

In some embodiments, the top wall 316a may include one or more openings 317a therein. An opening 317a may enable a heat sink mounted to a top surface of the cage 310 to contact a transceiver installed within the third channel 312c. A heat sink may be mounted to the top surface of the cage 310 using a clip. Such a heat sink is optional. FIG. 3 shows an opening 317a in the top wall of the third channel 312c to enable a heat sink to contact a transceiver in the third channel. Some embodiments may have a cage without such an opening. FIG. 16 shows a perspective view of an assembly 1000 including an electrical connector. The assembly 1000 includes a cage 1010. The cage 1010 includes an opening through a top wall. Heat sink 1090 is mounted to the top surface of the cage 1010 and covering the opening. The heat sink 1090 may be mounted to the cage 1010 using clip 1092. According to an embodiment, air may be flowed over such a heat sink 1090 mounted outside the cage 1010.

As illustrated in FIG. 3, the assembly 300 may include a connector 340. In some embodiments, the connector 340 may be disposed within the cage 310, and may be at the end of a cage or the end of a channel. In some embodiments, connector 340 may include one or more connector channels 344. A connector channel 344 may be arranged along the first direction. The connector channel 344 may enable air flowing through middle cage 350 to flow along the side of the connector 340, where it may pass through openings in the side wall of the cage. Such a configuration may increase airflow through the middle cage in comparison to an assembly without a connector channel. Alternatively or additionally, a connector channel may receive a portion of a heat transfer element disposed along the connector 340. In such a configuration, a heat transfer element may include a portion inside the cage and a portion outside the cage, with a portion, such as a heat pipe, in connector channel 344 connecting the portion inside and outside of the cage.

In some embodiments, the rear portion 310a of the cage may comprise a rear cover. In FIG. 3, rear portion 310a is shown as a separate piece from the cage 310. In other embodiments, the rear portion 310a may be integrally formed from the same component that forms other surfaces of cage 310. In some embodiments, there may be one or more holes 310b in the rear portion 310a therethrough. A hole 310b may be aligned with a connector channel 344, for example, to enable air to flow out of the connector channel 344 and/or to enable a portion of a heat transfer element to extend out of the cage.

In some embodiments, the connector 340 may include a surface 346 arranged at an obtuse angle relative to the air flow. Such a surface may divert air flowing through the second channel such that it exits the channel with lower resistance. In embodiments where air is flowed through the cage, the surface 346 may increase the volumetric flow rate of air through the cage. The surface 346 may be inset into the connector 340 between the first and second ports.

In some embodiments, the conductive side walls 316c may include one or more openings 317c and/or 317d therethrough. The openings 317c and/or 317d may be arranged along the first channel 312a, the second channel 312b, and/or the third channel 312c in one or more lines extending in the first direction or along another direction. In some embodiments, the openings 317c and/or 317d may be arranged adjacent to a connector channel 344. In embodiments where air is flowed through the cage 310, the openings 317c and/or 317d may increase the volumetric flow rate of air through the cage. Surface 346 may direct air towards at least one opening 317c and/or 317d. The openings 317c and/or 317d may allow some electromagnetic radiation to pass through the cage. The openings 317c and/or 317d may be sized and arranged in patterns such that the amount of electromagnetic radiation that passes through the holes does not interfere with the function of the cage to limit EMI emanating from or impinging upon transceivers in the channels.

Heat transfer element 320 may transfer heat from one component to another, and in some embodiments, may transfer heat from inside a cage to outside a cage such that the heat within the cage is dissipated. In some embodiments, heat transfer element 320 may Heat transfer may be achieved through conduction, convection, radiation, and/or phase change of a fluid. In some embodiments, a heat transfer element may comprise an active heat transfer element. In some embodiments, a heat transfer element may comprise moving components or fluids. In the example of FIG. 3, heat transfer element 320 transfers heat from transceivers inside cage 310 to outside the cage via a heat pipe.

Figure 4A:
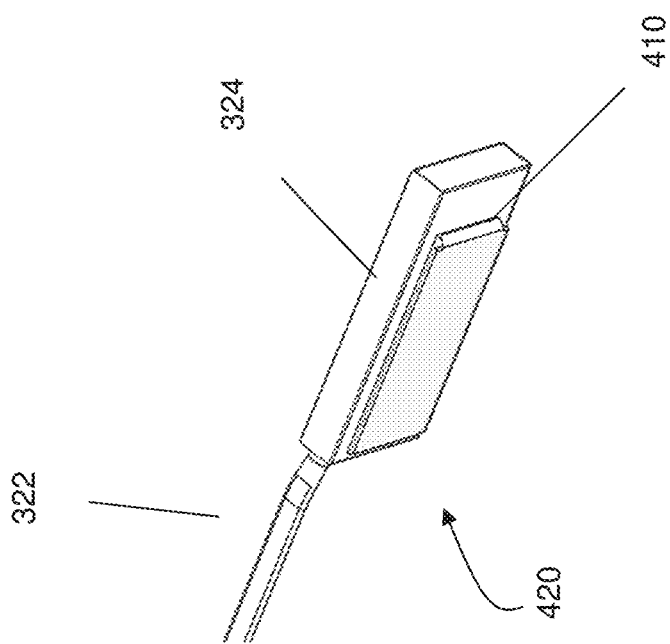
FIG. 4A is a bottom-left perspective view of a heat transfer element according to some embodiments.
Figure 4B:
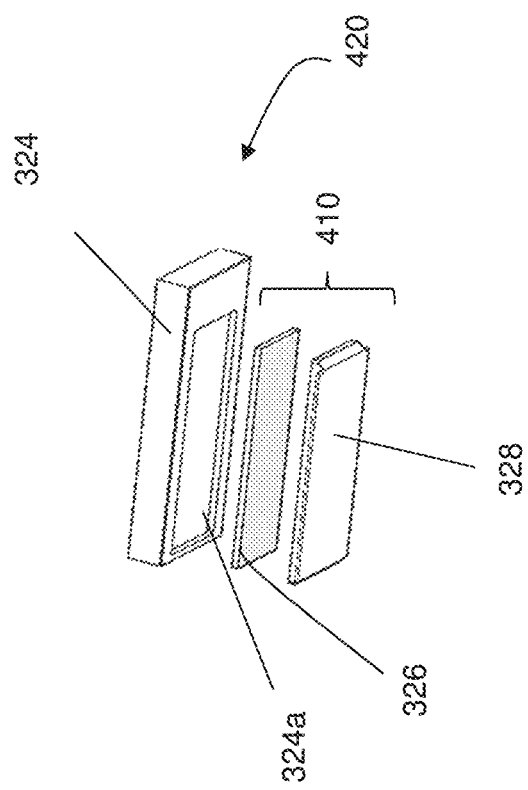
FIG. 4B is a bottom-left exploded perspective view of some components of a heat transfer element according to some embodiments.

FIG. 4A shows an assembled view and FIG. 4B shows an exploded view of heat transfer element 420. Heat transfer element 420 is configured to transfer heat from one transceiver in a channel of a cage below a channel housing the heat transfer element. Heat transfer element 420 may receive heat from a transceiver via conduction and then transfer heat outside the cage in other ways. In the illustrated embodiment, the heat transfer element 420 includes heat pipe 322, a base 324, and a compressible portion 410. Compressible portion 410 may serve as an interface between base 324 and a heat-generating component, such as a transceiver. The compressible portion may make thermal and/or mechanical contact with the heat-generating component.

In this example, the compressible portion includes a pad 326. In the exploded view of FIG. 4B, it can be seen that pad 326 is inset in a cavity 324a of the base 324. Pad 326 makes thermal and, in this embodiment, mechanical contact, with base 324 and plate 328. Pad 326 is compressible, providing travel. So long as plate 328 is within the range of travel of pad 326, pad 326 can provide a path of low thermal resistance between plate 328 and base 324.

In operation, heat transfer element 420 may be positioned with plate 328 extending into a channel receiving a transceiver, or other heat-generating component. Heat generated by the heat-generating component may flow to the base 324 through the compressible portion 410, such that heat may be transferred from the transceiver to heat transfer element 420. From there, heat can be further transferred via heat pipe 322, only a portion of which is visible in FIG. 4A.

Figure 4C:
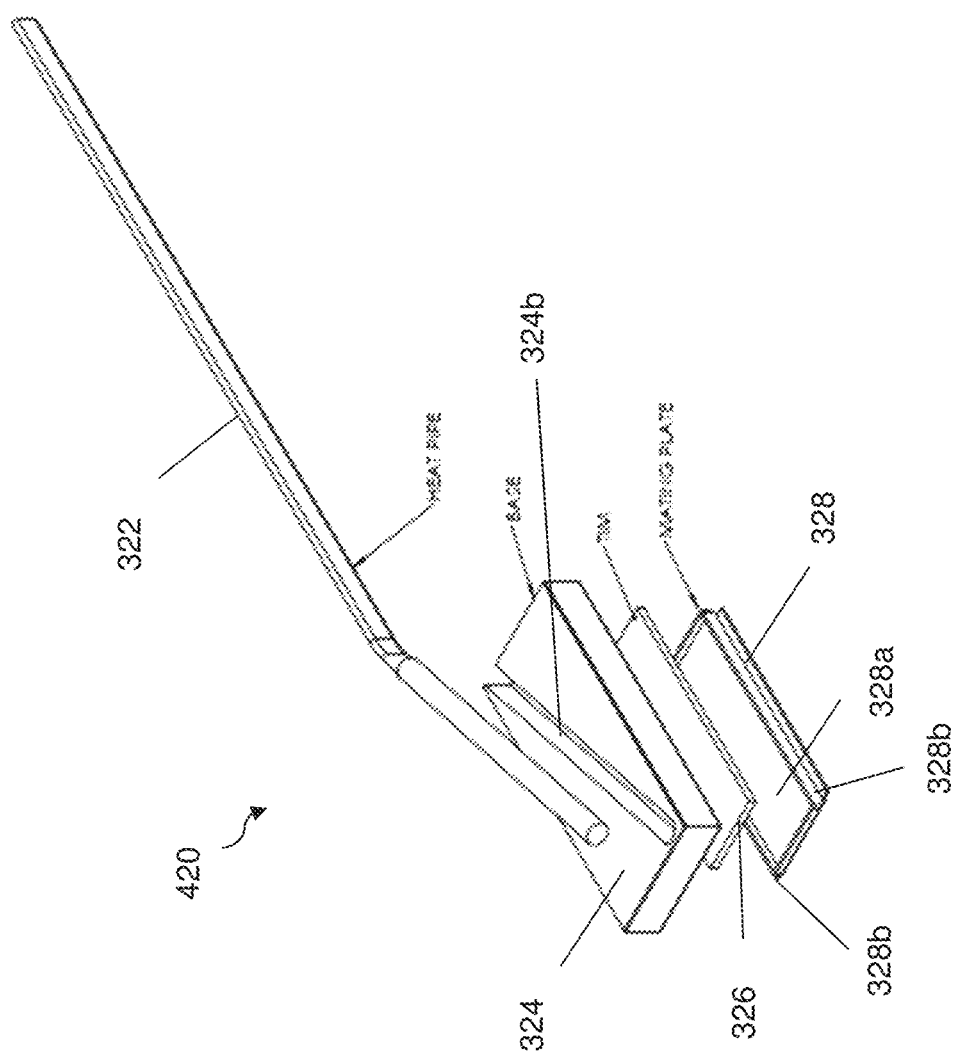
FIG. 4C is a top-right exploded perspective view of a heat transfer element according to some embodiments.

FIG. 4C shows that heat pipe 322 is attached to base 324 so as to provide good thermal contact between those component. In the illustrated embodiment, base 324 includes a channel 324a in which the hot end of heat pipe 322 is installed. Thermal and mechanical contact may be made between heat pipe 322 and base 324 through mechanical means, such as by compressing heat pipe 322 as it is inserted into channel 324a. Other suitable attachment mechanisms include soldering, welding, brazing and the use of a thermally conductive adhesive.

Heat pipe 322 may transfer heat from base 324 to a location outside the cage. Heat pipe 322 may include one or more internal components configured to transfer heat from a first end of the heat pipe to a second end of the heat pipe. As illustrated, a first end of the heat pipe is mechanically and/or thermally coupled to the base 324. A fluid in the heat pipe may transfer heat between the first and second ends. The fluid may be selected based on material properties, for example, thermal conductivity or specific heat. The fluid may be water. In some embodiments the fluid has a higher specific heat and/or thermal conductivity than water and/or lower boiling point.

The first end of heat pipe 322 may be a hot end, which may be in contact with a solid surface, such as base 324. During operation, the fluid may absorb heat at the hot end and undergo a phase change from a liquid into a gas. The fluid may flow as gas to the second end of the heat pipe. The second end of the heat pipe may be a cold end. During operation, the fluid may condense to a liquid at the cold end, releasing heat stored in the fluid. The fluid may then return as liquid to the first end by capillary action, gravity, or another method.

Thus, the heat pipe 322 may transfer heat from a first end to a second end. The first end may be disposed inside a cage, and may be in thermal contact with a heat-generating element or other element from which heat is to be dissipated, for example, a transceiver. The second end may be disposed outside the cage, and may be adjacent a heat dissipating element so that heat generated by a component inside the cage is dissipated outside the cage.

The materials used to construct base 324 may be selected based on material properties, for example, thermal conductivity or specific heat. As an example, in some embodiments, base 324 may be made of a metal. Base 324 may include a cavity 324a on a first side. The cavity may be configured such that another portion of the heat transfer element may be disposed in the cavity to facilitate heat flow between plate 328 and base 324. Such a cavity may receive pad 326 and capture it between the plate 328 and the base 524. Pad 326 may be compressible so as to provide travel that enables mechanical and thermal contact between plate 328 and a heat-generating component.

In some embodiments, the materials from which the compressible portion is formed, such as pad 326, may be selected based on thermal properties such as thermal conductivity or specific heat. In accordance with some embodiments, the compressible portion may have a thermal conductivity greater than 1 W/m·K (Watt per meter-degree K measured at 25° C.). For example, the thermal conductivity may be between 1 and 8 W/m·K or between 2 and 8 or between 2.5 and 8.

Alternatively or additionally, the materials from which the compressible portion is formed, such as pad 326, may be selected based on mechanical properties, for example, compressibility.

In the embodiment of FIG. 3, a removable transceiver may be inserted into the first channel 312a to mate with the first port 342a in order to make electrical and/or optical connections from a cable coupled to the transceiver to the port. To dissipate heat from the transceiver, it may be desirable to contact the transceiver with a large surface area. In some embodiments, it may be desirable to configure a heat transfer element 320 such that the heat transfer element will continue to contact an inserted transceiver, even after continued use. For example, the compressible portion may be a compressible material such that, in operation, the compressible portion compresses as the transceiver is inserted into the first channel and pushed into contact with the compressible portion. For example, the pad 326 may be a compressible material such that the pad compresses as a transceiver is inserted and pushed into contact with the plate 328.

The compressible portion may have a first thickness. In some embodiments, a first thickness may relate to an non deformed state of the compressible portion or a resting state of the compressible portion. The compressible portion may elastically and/or plastically deform to a second thickness. The compressible portion, for example, may compress in thickness up to 10%, 20%, 30% or 40% in some embodiments, under the forces generated upon insertion of a transceiver into a cage. Alternatively or additionally, the compressibility may provide travel of 0.1 to 0.5 mm in an embodiment in which pad 326 is 1-3 mm thick, for example. In some embodiment, the second thickness may be less than the first thickness. In some embodiments, a compressible portion may be compressed, under a force of 20 N from a thickness of about 2 mm to about 1.5 mm. In some embodiments the compression may be at least 15%, such as between 15% and 40% of the uncompressed state of the material under a force between 5 and 40 N.

In some embodiments, the compressible portion may expand to the first thickness when not under pressure. In some embodiments the compressible portion may be mounted next to a biasing element that urges the compressible portion to contact a transceiver. The compressible portion may have a travel defined by the difference between the first and second thickness. In some embodiments, the travel of the compressible portion may be at least 0.5 mm, such as between 0.5 mm and 3 mm. In this way, if base 324 is within this travel distance of the transceiver, plate 328 may be pressed against the transceiver, so as to provide good thermal coupling. Heat may then be transferred through pad 326 to base 324.

In some embodiments, when a removable transceiver is removed from the first channel 312a, the compressible portion may regain its first thickness, or a thickness which is between the first and the second thickness.

FIGS. 4A-4C illustrate a heat transfer element with one compressible portion. It may be desirable in some embodiments for a heat transfer element to include more than one compressible portion. For example, FIG. 3 shows a heat transfer element 320 that is positioned to make contact with two transceivers. A heat transfer element for this configuration may have two compressible portions, which may have the same properties or may have different properties. For example a heat transfer element may be configured to transfer more heat from a transceiver in channel 314a than from 314c, so as to equalize temperature rise in each transceiver.

Figure 5:
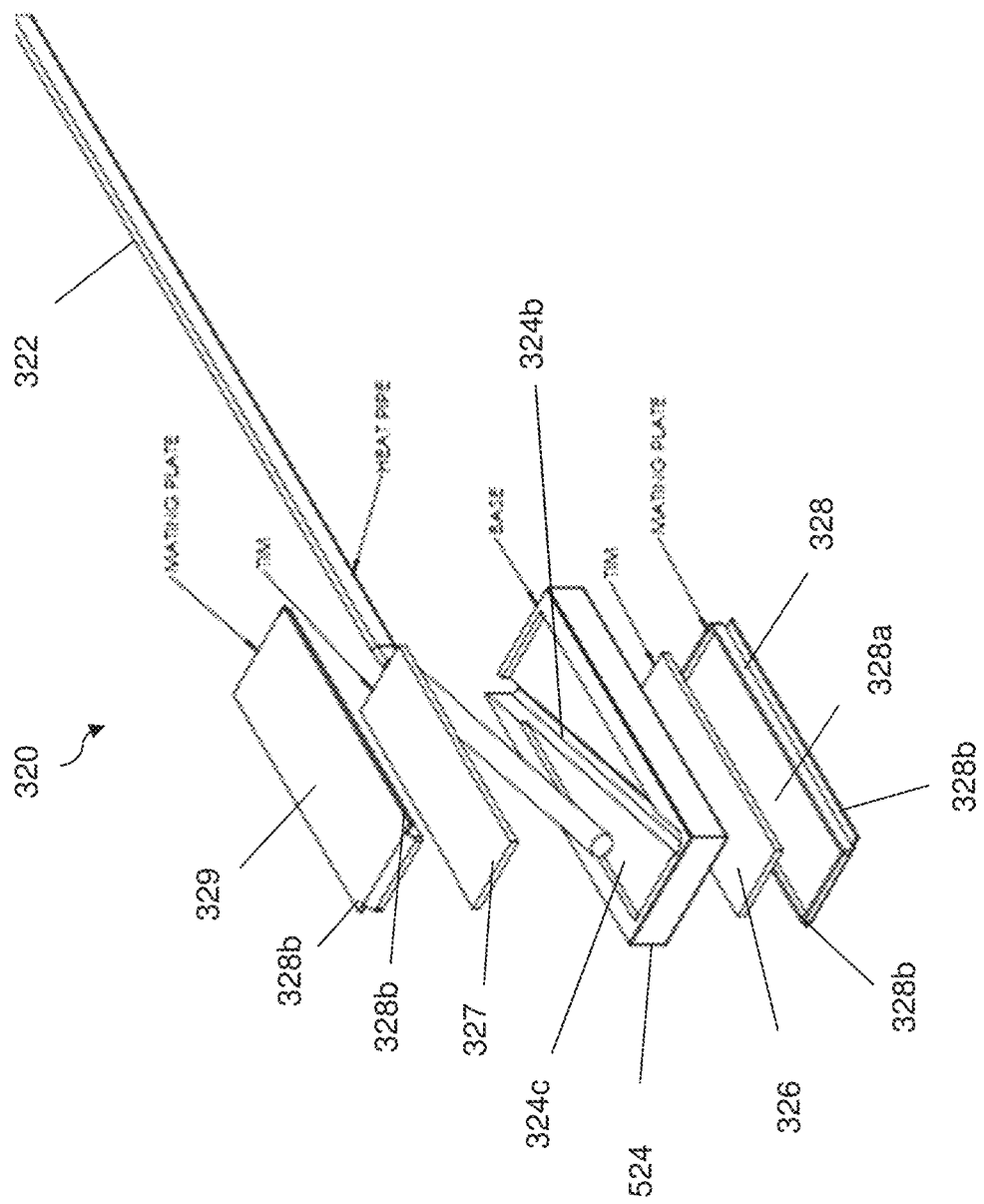
FIG. 5 is a top-right exploded perspective view of a heat transfer element according to some embodiments.

FIG. 5 shows an exploded perspective view of an embodiment of a heat transfer element 320 configured to make contact with two heat generating elements. In the illustrated embodiment, heat transfer element 320 has two interfaces, each with a compressible portion, which may be formed as described above in connection with compressible portion 410. In contrast to the embodiment of FIGS. 4A to 4C, with one plate to contact one heat-generating component, heat transfer element 320 has two plates 328 and 329, each configured to contact a heat generating component. Heat transfer element 320, for example, may be installed in a second channel 312b, between a first channel 312a and a third channel 312c, such that heat transfer element 520 may transfer heat from transceivers within first channel 312a and third channel 312c.

In some embodiments, plates 328 and 329 may be similarly configured. Accordingly, plate 328 may be representative of plate 329. Plate 328 may be a thermally conductive plate. Plate 328 may be mechanically and/or thermally coupled to the thermal pad 326. In some embodiments, plate 328 may contact a first surface of the pad 326. The plate 328 may be selected based on material properties, for example, thermal conductivity or specific heat. The plate 328 may include a cavity 328a, which may be configured such that a pad or other structure may be disposed in the cavity. The cavity 328a may ensure that the pad 326, which may be a thermal pad, may be held between the plate 328 and the base 524, thereby allowing heat to be transferred from the transceivers disposed in the cage to the heat element and a heat dissipating element.

The pad 326, and plate 328 may be arranged on a first side of the base 524. In some embodiments, the cavity 324a may be a first cavity, the pad 326 may be a first pad, and the plate 328 may be a first plate. In such embodiments, the heat transfer element 320 may include a compressible portion which is a second compressible portion. The second compressible portion may include a second pad 327 and/or a second plate 329 In some embodiments, the second pad 327 and the second plate 329 may be respectively constructed the same as the first pad 326 and the first plate 328. The base 524 may include a second cavity 324c. The second cavity 324c, the second pad 327, and the second plate 329 differ from the first cavity 324a, the first pad 326, and the first plate 328 in that they are be arranged on a second side of the base 524. The second cavity 324c may be arranged over the channel 324b. The second side of the base 524 may be opposite the first side of the base.

Plate 328 may include portions 328b, which may be configured to engage with a biasing element that biases plate 328 towards a transceiver or other element generating heat. In the embodiment illustrated, portions 328b are disposed along edges of plate 328 such that a biasing element may be disposed adjacent to the portions 328b, for example, between the portions 328b and the base 322. A biasing element, such as a spring finger or a clip, may press against portions 328b so as to urge plate 328 or 329 into contact with a transceiver when inserted into the first or third channels when the transceiver is inserted. In the embodiment illustrated, portions 328b are thinner than other portions of the plate 328 or 329. The portions 328b may be arranged on opposite sides of the plate 328, extending in the first direction.

In some embodiments, the plate 328 may be coupled to a portion of the middle cage 350. For example, middle cage 350 may have rails or other support structures around an opening between the middle cage and an adjacent cage receiving a transceiver. Portions 328b, or other suitable features on plate 328, may be sized to press against the rails when the compliant portion of the heat transfer element is fully expanded.

Figure 6A:
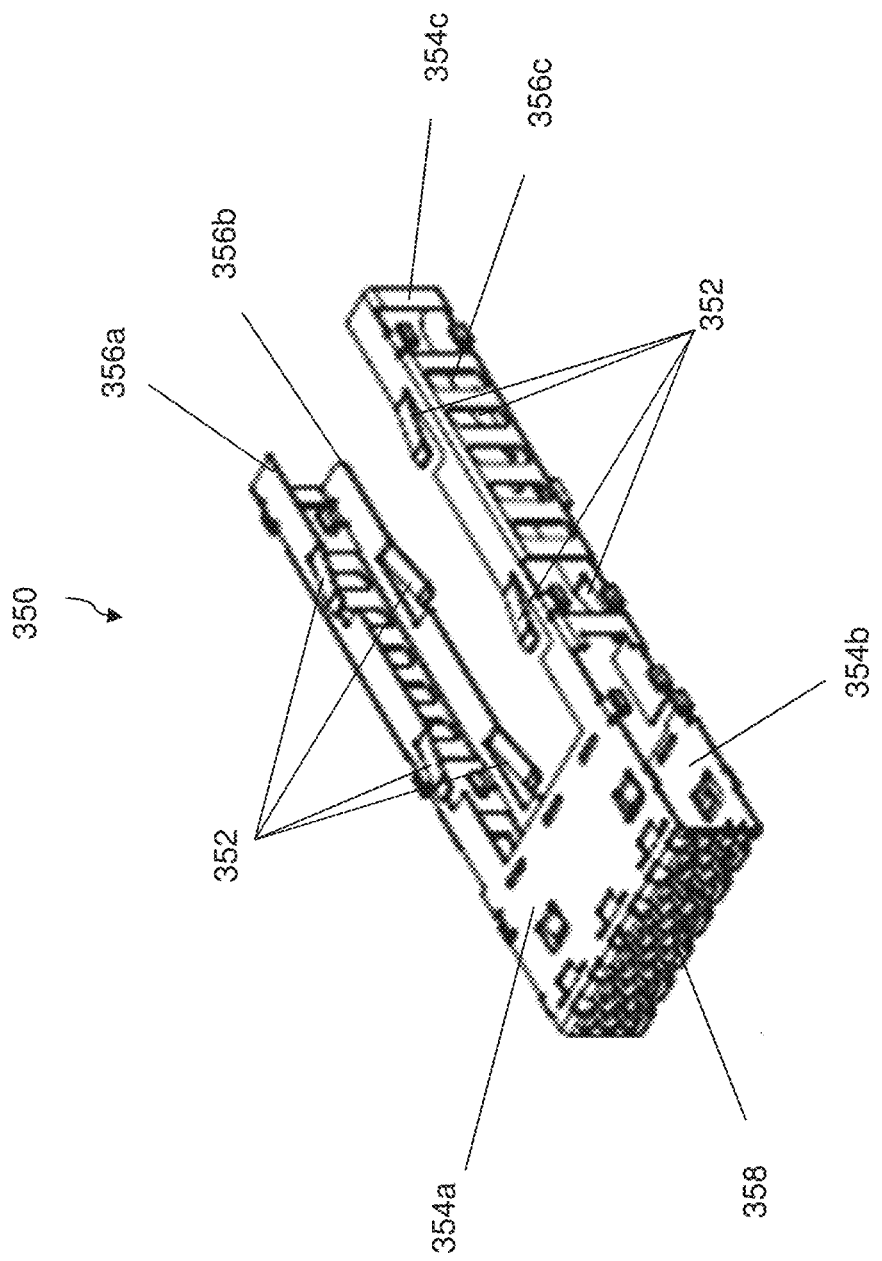
FIG. 6A is a top-right perspective view of a middle cage according to some embodiments.

FIG. 6A shows an illustrative embodiment of a middle cage 350 into which heat transfer element 320 may be installed. Middle cage 350 is here shown with spring fingers for biasing plates such as 328 and 329 towards transceivers in channels above and below middle cage 350. Middle cage 350 may be disposed in or form the second channel 312b. In some embodiments, the middle cage may be disposed between the first channel 312a and the third channel 312c. In accordance with some embodiments, a cage, such as cage 310, may be formed with a second channel by attaching middle cage 350 to sidewalls of the cage.

Middle cage 350 may include at least one top wall 354a, at least one bottom wall 354b, and at least one side wall 356c. In some embodiments, the bottom wall 354b of the middle cage 350 may be disposed between the first channel 312a and the second channel 312b. Bottom wall 354b may separate the first channel form the second channel. In some embodiments, the first channel may have a top wall parallel to bottom wall 354b. In such an embodiment, the top wall of the first channel may have an opening through which a heat transfer element in middle cage may contact a transceiver in the first channel.

In some embodiments, the top wall 354a may be disposed between the second channel 312b and the third channel 312c. Top wall 354a may separate the third channel form the second channel. In some embodiments, the third channel may have a bottom wall parallel to top wall 354a. In such an embodiment, the bottom wall of the third channel may have an opening through which a heat transfer element in middle cage may contact a transceiver in the third channel.

The at least one top wall 354a, the at least one bottom wall 354b, and the at least one side wall may be conductive walls. The at least one top wall 354a may include at least one opening 356a. The at least one bottom wall 354b may include at least one opening 356b. The at least one side wall 354c may include at least one opening 356c. Openings may be configured such that at least a portion of a heat transfer element, which may be heat transfer element 320, may extend through at least one opening. Openings may be configured such that heat and/or air may travel from inside the middle cage 350 to outside the middle cage.

In some embodiments, any of the walls of a middle cage may form or include rails against which a portion of the heat transfer element may rest. The rails may be configured to guide and/or receive a heat transfer element into the middle cage or into the second channel. In some embodiments, rails may support a base of the heat transfer element in the middle cage while enabling a compressible portion of the heat transfer element to extend into a channel adjacent the middle cage. One or more biasing elements may be cut from or attached to a surface of the rails. The biasing elements may extend from the rails so as to bias at least a portion of the heat transfer element away from the rail and into an adjacent channel.

In some embodiments, the middle cage may include at least one biasing element, here shown as spring fingers 352. In the illustrative embodiment of FIG. 6A, the middle cage includes eight spring fingers 352, where four face the first channel and four face the second channel. An end of a spring finger 352 may have a travel which is defined as the difference in vertical location of the end of the biasing element when a transceiver is disposed in an adjacent channel and when a transceiver is not disposed in an adjacent channel. In some embodiments, the travel of the biasing element may be similar to the travel of a compressible portion may, and/or may be at least 0.2 mm or in the range of 0.2 to 1 mm, as another example.

In some embodiments, the biasing elements may comprise springs, spring members, spring fingers, or clips. The biasing elements, such as spring fingers 352, may be formed in at least one of a top wall 354a, a bottom wall 354b, or a side wall 354c. In some embodiments, the biasing elements may be arranged such that they are between the base 322 and the plate 328 of the heat transfer element 320. In some embodiments, biasing elements may be arranged adjacent to the pad 326. A biasing element may bias the plate 328 into an adjacent channel, for example, the first channel 312a or the third channel 312c such that it is positioned to contact a transceiver when the transceiver is inserted in the first channel 312a or the third channel 312c. In some embodiments, a biasing element may be positioned so as to urge at least a portion of a heat transfer element disposed within the second channel and/or middle cage towards an adjacent channel, for example, the first channel.

In some embodiments, the middle cage may include at least one front opening 358. The at least one front opening 358 may be configured to allow air to flow into the middle cage 350. In some embodiments, the at least one front opening 1358 may be aligned with openings in the cage 310 and/or aligned with openings in other elements disposed in the cage.

Figure 6B:
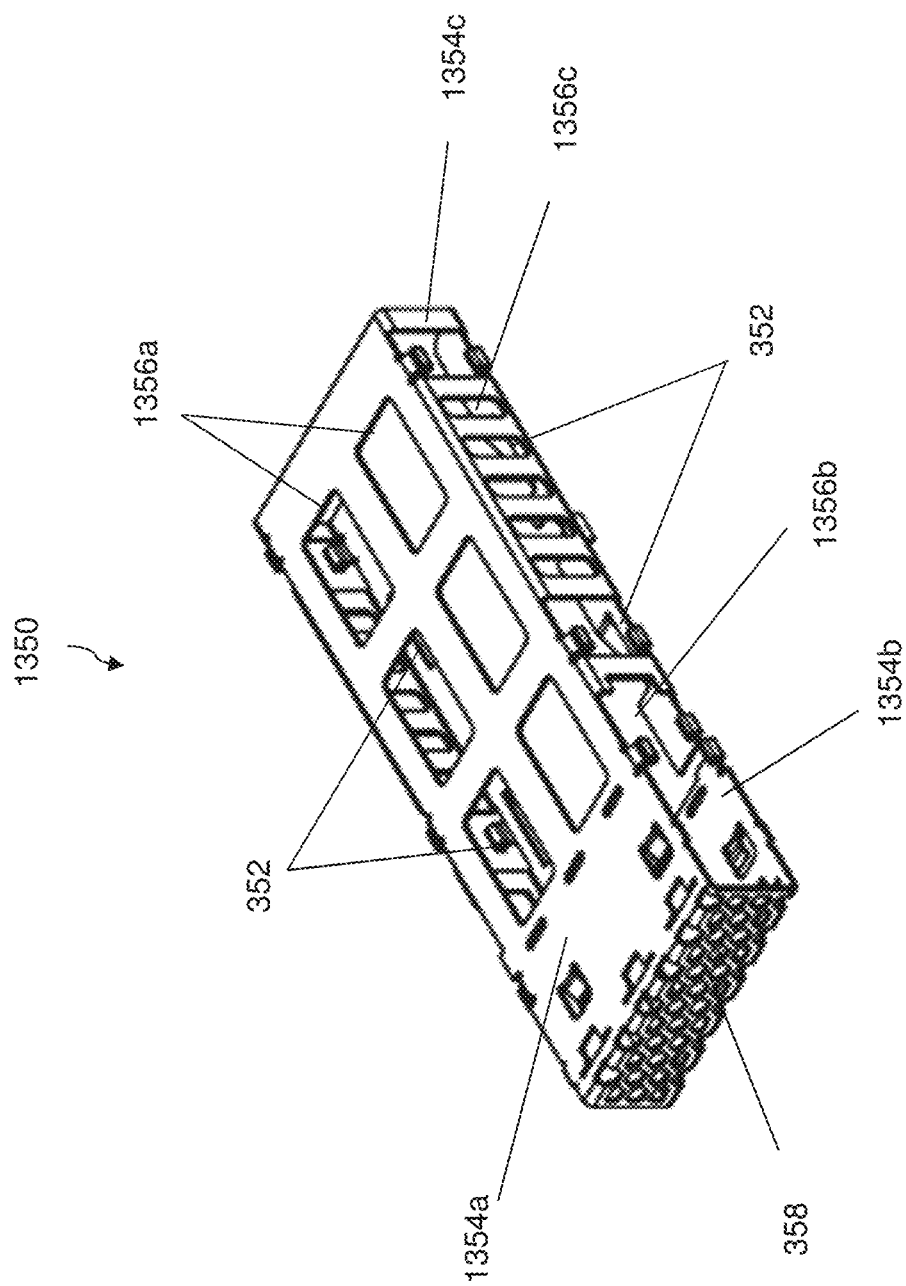
FIG. 6B is a top-right perspective view of a middle cage according to some embodiments.

FIG. 6B shows an alternative embodiment of a middle cage 1350. Middle cage 1350 may differ from middle cage 350 (FIG. 6A) in the respect that middle cage 350 is configured to promote contact between a heat transfer element disposed in middle cage 350 and transceivers in both the first channel and the third channel, whereas middle cage 1350 is configured for contact between a heat transfer element and a transceiver in only one adjacent channel. In this embodiment, middle cage has an opening to make contact to transceiver in a channel below the middle cage.

The middle cage 1350 may include at least one top wall 1354a, at least one bottom wall 1354b, and at least one side wall 1354c. The walls of the middle cage 1350 may differ from the walls of cage 350 in the respect that they are configured to allow only one compressible portion to extend from a heat transfer element.

The middle cage 1350 may include at least one opening 1356a, 1356b, and/or 1356c respectively through the at least one top wall 1354a, at least one bottom wall 1354b, and at least one side wall 1356c, which may be configured to promote heat transfer or air flow or may to allow a compressible portion to extend from the middle cage to an adjacent channel. The openings 1356a in the top wall 1354a differ from the hole 356a in that they are smaller and not configured to allow a heat transfer element to extend therethrough. The middle cage 1350 may include at least one front opening 358.

Middle cage 1350 has an opening in bottom wall 1354b through which a portion of a heat transfer element may extend to contact a transceiver in an adjacent channel. Top wall 1354a has openings, which are not large enough to allow a heat transfer element, for example, heat transfer element 1320, to pass through and contact a transceiver disposed in an adjacent channel.

The middle cage 1350 may include at least one biasing element, here shown as a spring finger 352. In contrast to the middle cage 350 of FIG. 6A, middle cage 1352 has four total biasing elements all of which are arranged facing the first channel.

FIG. 6C shows a side view of a middle cage 1350 in which two spring fingers 352 are visible. However the principle illustrated in FIGS. 6C and 6D also apply to the middle cage 350. FIG. 6D shows a detail view of a spring finger 352. As shown in FIG. 6D, spring finger 352 biases plate 328 into a channel adjacent to the middle cage. Though not visible in this cross section, pad 326 may be between base 324 and the plate 328 and may expand or compress to fill a space between the base 324 and the plate 328.

An assembly including an electrical connector may include at least one heat dissipating element outside of the cage. A heat dissipating element may be thermally coupled to the heat transfer element. In some exemplary embodiments, the heat dissipating element may be a heat sink, a cold plate, or another element to dissipate heat generated by a component disposed within the cage, for example, a transceiver. The heat, once transferred outside the cage, may be dissipated into a flow of air through an electronic assembly, such as may be created by a cooling fan, as discussed above in connection with FIG. 1. However, it should be appreciated that heat might be dissipated by other fluids, such as cooling water, or dissipated in any other suitable way.

Figure 7:
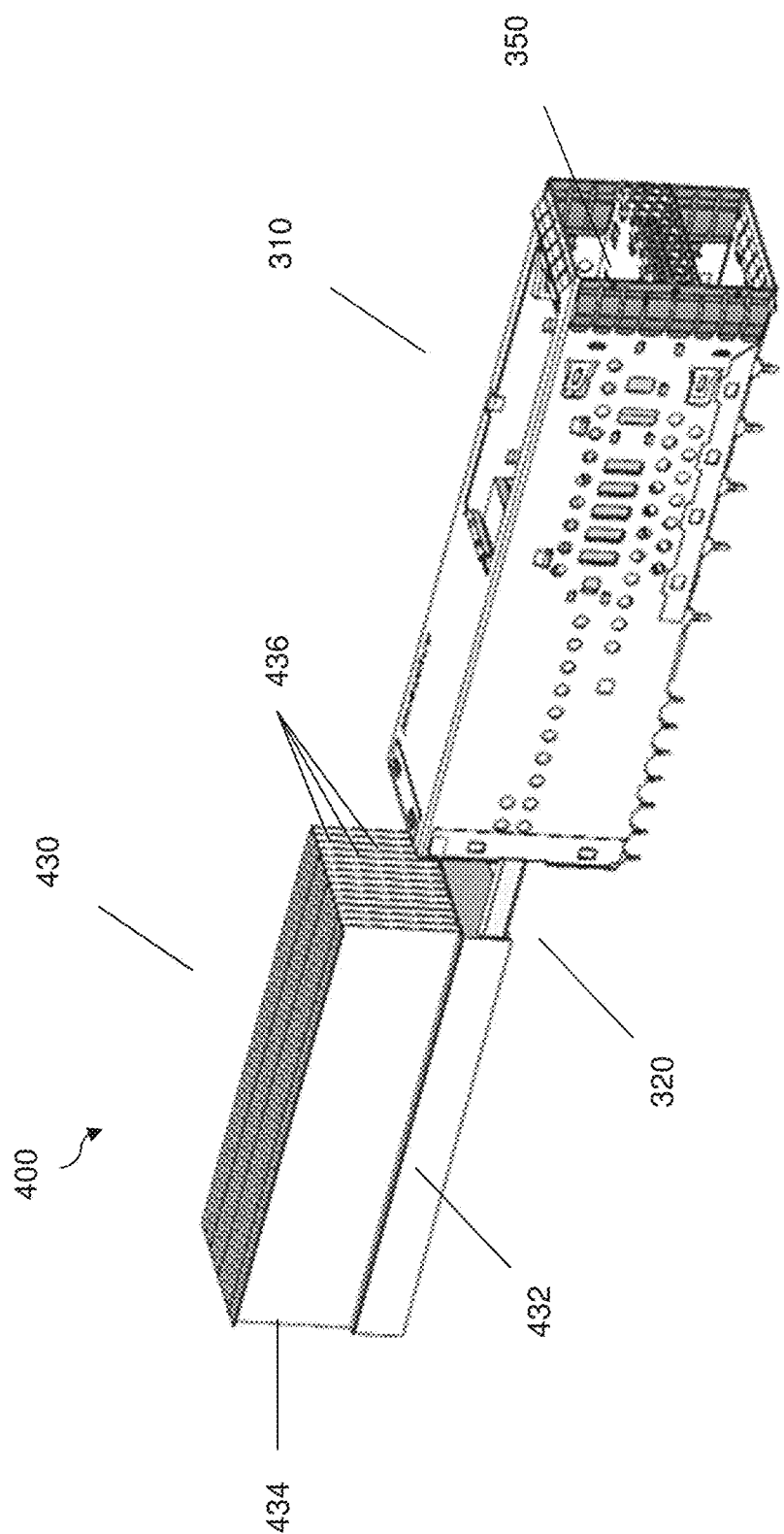
FIG. 7 is a front-left perspective view of a cage with associated thermal management components according to some embodiments.
Figure 8:
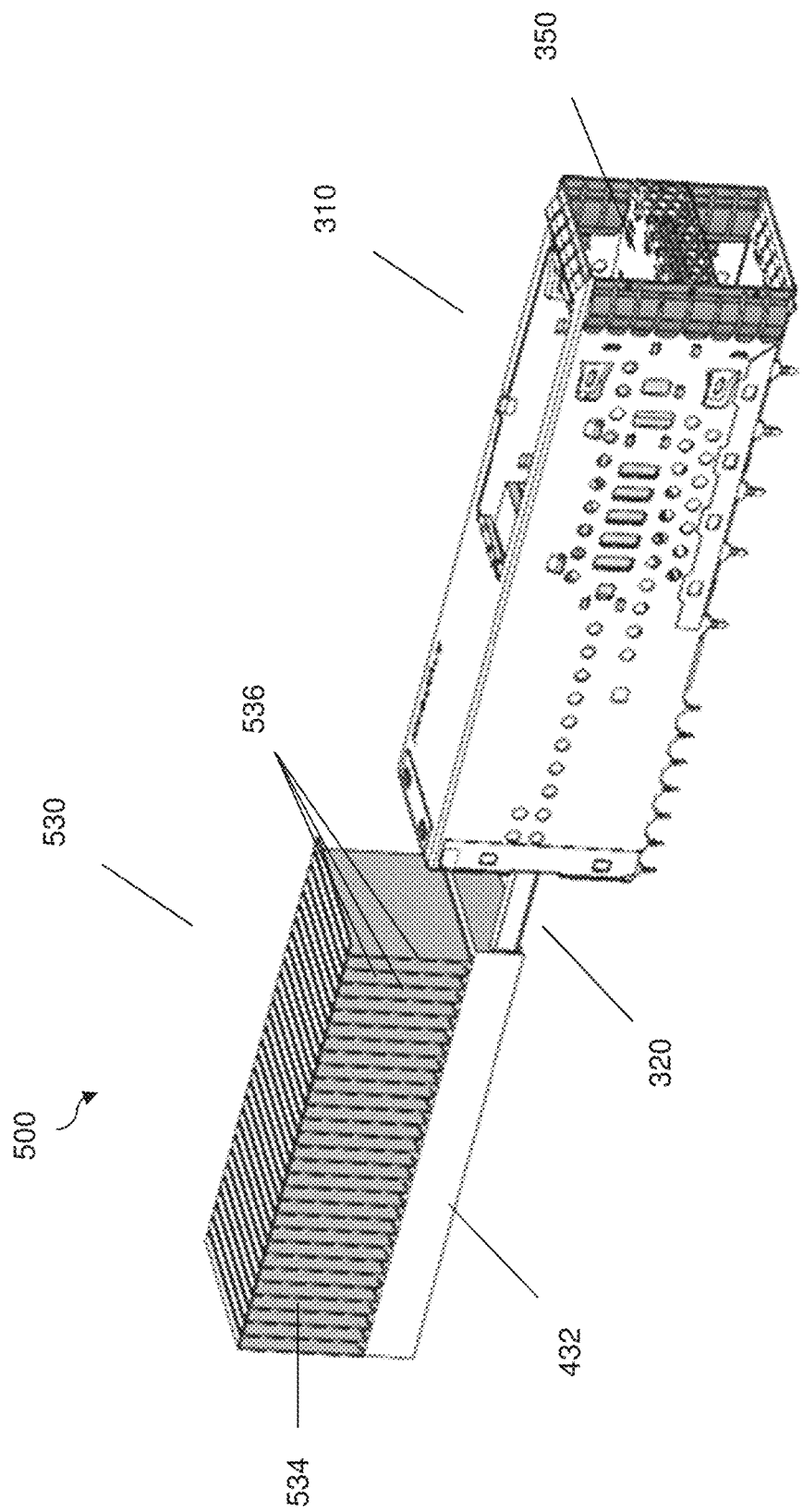
FIG. 8 is a front-left perspective view of a cage with associated thermal management components according to some embodiments.
Figure 9:
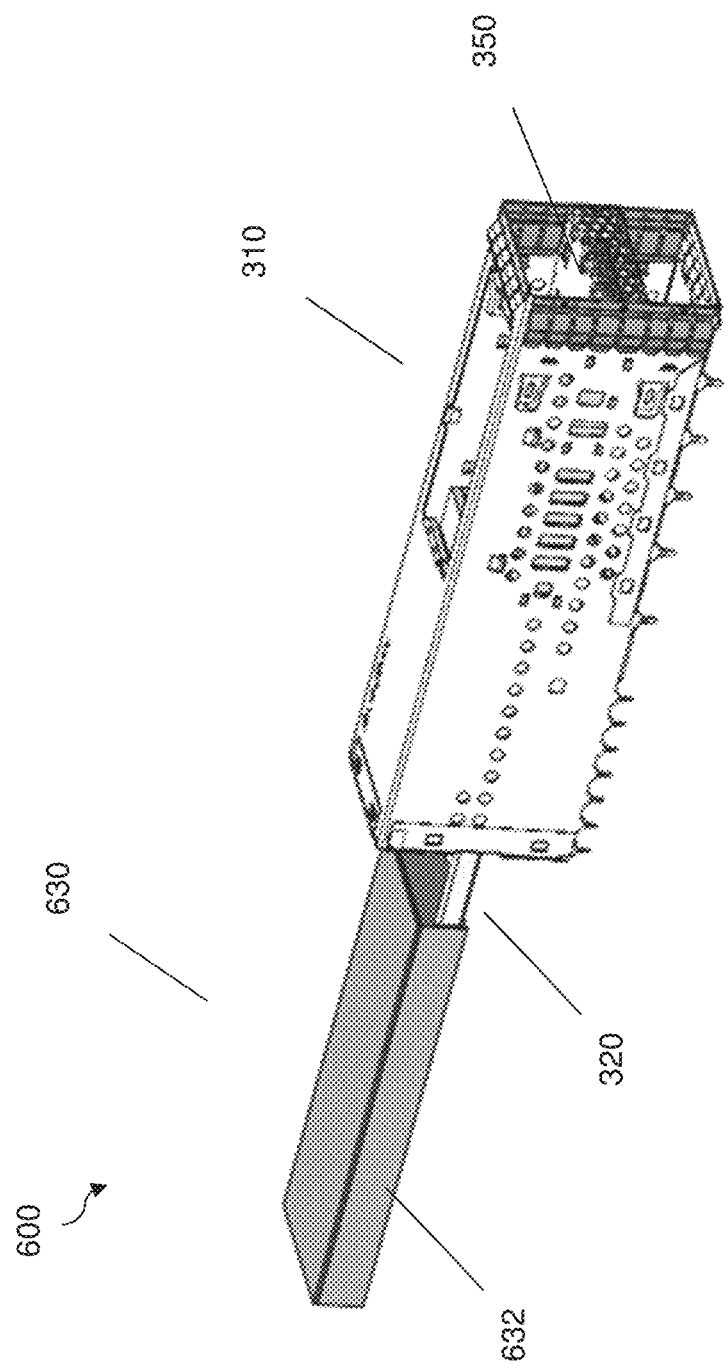
FIG. 9 is a front-left perspective view of a cage with associated thermal management components according to some embodiments.

FIGS. 7-9 illustrate an exemplary embodiment of an assembly including a heat dissipating element. FIG. 7 is an illustrative embodiment of a portion of an assembly 400 including a heat generating element, a heat transfer element and a heat dissipating element. One of skill in the art will understand that an electronic assembly will have other components in addition to those expressly illustrated. FIG. 7, for example, illustrates a cage 310 enclosing a connector, which may be mounted to a printed circuit board, which is not expressly illustrated. Such a printed circuit board may form a portion of an electronic system as described above in connection with FIG. 1. A single, double stacked cage 310 is shown, but an electronic system may have multiple such stacked cages aligned side-by-side and may include stacked cages with more than two ports.

Figure 15:
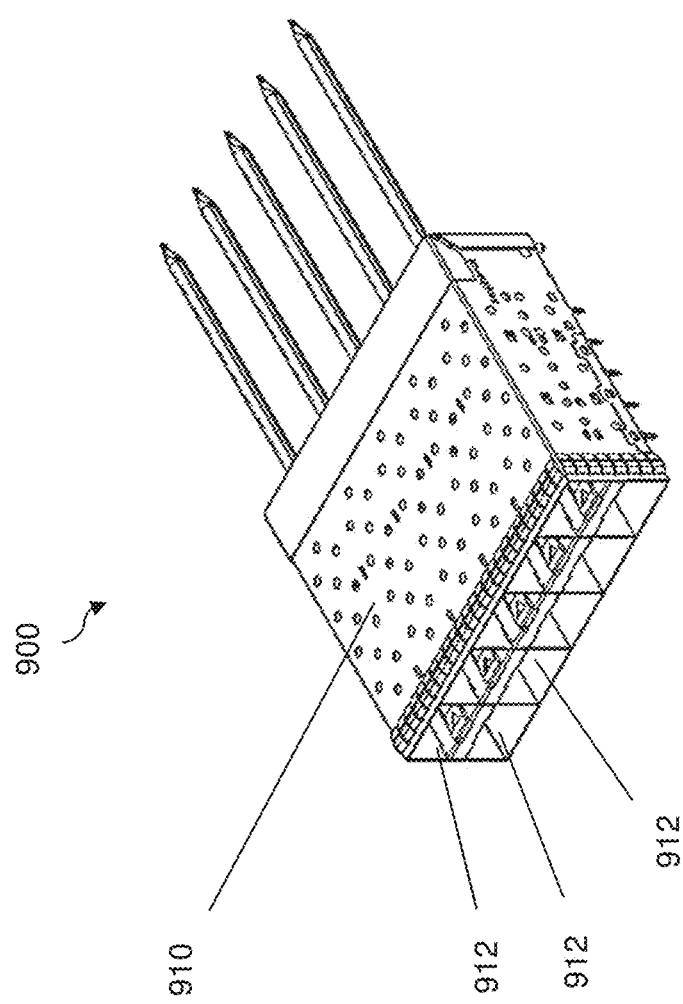
FIG. 15 is a front-right perspective view of a cage according to some embodiments.

Some embodiments may include other cages with other arrangements of channels. For example, FIG. 15 shows an assembly 900 including an electrical connector. The assembly 900 includes a cage 910. The cage 910 includes a two by five arrangements of channels 912. A configuration of heat transfer elements and heat dissipating elements as described herein may enable various arrangements of channels and transceivers, particularly arrangements which may be relatively dense arrangements of transceivers.

Such systems may, with high density I/O connectors generate more than 25 W of heat per linear inch of board edge in the region where I/O connectors are installed. The heat generation, for example, may be in the range of 25 to 40 W per inch. A configuration as illustrated may dissipate such heat without a temperature rise exceeding the operating specifications for transceivers plugged into those I/O connectors. Heat may be dissipated from the transceivers such that a temperature rise of both transceivers relative to an off state of the transceivers is less than 25 degrees C. With such a configuration, the heat dissipated from within the cage may be sufficient that this temperature rise may be achieved even with the electronic enclosure in an ambient environment of 25 degrees C.

Assembly 400 includes a cage 310 and a connector (not visible). Assembly 400 includes a heat transfer element 320. However, the assembly may alternatively include a heat transfer element in other configurations, such as heat transfer element 1320. Here, the heat transfer element includes a heat pipe, a base, and a compressible portion comprising a pad, and a plate. In the illustrative embodiment, the assembly 400 includes a middle cage 350. However, the middle cage may be in other configurations, such as middle cage 1350.

Assembly 400 includes a heat dissipating element 430 which may be thermally coupled to the heat transfer element 320 of the assembly 400. In the illustrated embodiment of FIG. 7, the heat dissipating element includes a plate 432 and a heat sink 434. Plate 432 may contain a reservoir of fluid that flows through heat transfer element 320. In an embodiment in which heat transfer element is a heat pipe, vapor generated by heat absorbed by the heat transfer element may condense within plate 432, thus delivering heat generated by one or more transceivers inside cage 410 to plate 432.

Heat may then be dissipated from plate 432. In the embodiment illustrated, heat sink 434 may increase the rate at which heat is dissipated. Air flowing over the heat sink may carry the heat away from the components. In the illustrated embodiment, the heat sink 434 includes fins 436 aligned with the elongated dimension of the channels, and air may be flowed parallel to the direction, for example, by a fan, to dissipate heat from the heat sink 434.

In the embodiment of FIG. 7, the heat dissipating element is offset from cage 410 in the first direction, parallel to the direction of cooling air flow. Here, the heat dissipating element is aligned with cage 410 to provide a compact configuration. However, the heat dissipating element is separated from cage 410 by a sufficient distance, such as at least 1 inch, 2 inches or 3 inches, that airflow is not fully blocked from reaching heat dissipating element 430. Cages for a plurality of I/O connectors, with associated heat dissipation elements may be disposed in an area along an edge of a printed circuit board. That area may extend, for example, less than 6 inches from the board edge. That board edge may be adjacent to the panel of an electronic system through which the electronic system is connected to multiple cables. One or more cooling fans may be installed at the opposite side of the electronic device. The panel, for example, maybe at the front of an equipment rack.

However, the application is not limited in this respect, and the heat dissipating element may be in one or more locations or have other configurations than expressly illustrated. For example, in some embodiments, the heat dissipating element 430 may not include a plate or may not include a heat sink.

In some embodiments a heat transfer element and/or a heat dissipating element may include or be connected to one or more structures that may force fluid to flow through the heat transfer or dissipating element. In some embodiments, the structure may comprise a pump or the head dissipating element may be connected to a pressurized water source.

For example, the plate 432 may be a cold plate that dissipates heat by flowing a fluid through the plate. The fluid may be similar to other fluid described with respect to the current application. Alternatively or additionally, the plate 432 may be coupled to a cold plate such that heat may be transferred from plate 432 to the cold plate.

FIG. 8 is an illustrative embodiment of assembly 500 including an electrical connector. Assembly 500 includes a cage 310 and a connector (not visible). In the illustrated embodiment, assembly 500 includes a heat transfer element 320, but the heat transfer element may have other configurations, such as heat transfer element 1320. A heat transfer element may include a heat pipe, a base 324, and a compressible portion comprising a pad, and a plate. In the illustrative embodiment, the assembly 500 includes a middle cage 350, however, the assembly may alternatively include middle cage 1350.

Assembly 500 differs from assembly 400 (FIG. 7) in that it is configured for use in an electronic system with cooling air flowing to dissipate heat from the heat sink 534 in different direction. In the illustrated embodiment, heat sink 534 includes fins 536 aligned perpendicular with the elongated dimension of the channels of the cage. Such a configuration may be used in a system with air flow perpendicular to the elongated dimension of the channels of the cage. The direction of the airflow may be controlled by, among other things, placement of a fan within an enclosure housing the components. The assembly of FIG. 7, for example, may have an enclosure with a front panel with openings of the cage extending exposed in openings in the front panel. One or more fans may be positioned at the rear of the enclosure to cause air flow aligned with the elongated dimensions of the channels of the cage. The assembly of FIG. 8, for example, may be used in a similar enclosure, but with the fan or fans in a side wall of the enclosure.

Such a configuration may be enable use of high density I/O connections in a device that lacks the front to back space in a rack or other assembly for cooling fans to draw air to dissipate heat with the densities described above in connection with FIG. 7. Enabling use of fans installed in other locations, such as on side walls of an electronic device perpendicular to the panel through which I/O connections are made, provides a system designer greater flexibility in designing electronic devices.

FIG. 9 is an illustrative embodiment of assembly 600 including an electrical connector. Assembly 600 includes a cage 310 and a connector (not visible). In the illustrated embodiment, assembly 600 includes a heat transfer element 320, however, the assembly may alternatively include a heat transfer element in other configurations such as heat transfer element 1320. The heat transfer element may include a heat pipe, a base, and a compressible portion comprising a pad, and a plate. In the illustrative embodiment, the assembly 600 includes a middle cage 350. However, the assembly may alternatively include middle cage 1350.

Assembly 600 includes a heat dissipating element 630 which may be thermally coupled to the heat transfer element 620 of the assembly 600. In the illustrated embodiment of FIG. 9, the heat dissipating element includes a plate 632. The plate 632 may be selected based on one or more material property, for example, thermal conductivity or specific heat. In the illustrated embodiment, the plate 632 is coupled to the heat pipe 322 of the heat transfer element 320 such that heat may be transferred from the heat pipe to the plate.

The embodiment illustrated in FIG. 9 differs from the embodiments of FIGS. 7 and 8 in that, instead of a heat sink with projections configured to release heat into a flowing air stream, plate 632 is a cold plate configured to dissipate heat, for example, by flowing a fluid through the plate. The fluid may be similar to other fluid described herein. Piping to supply and remove water from plate 632, such as copper pipes or flexible hoses, are not expressly illustrated, but may be routed in any suitable way.

Figure 10:
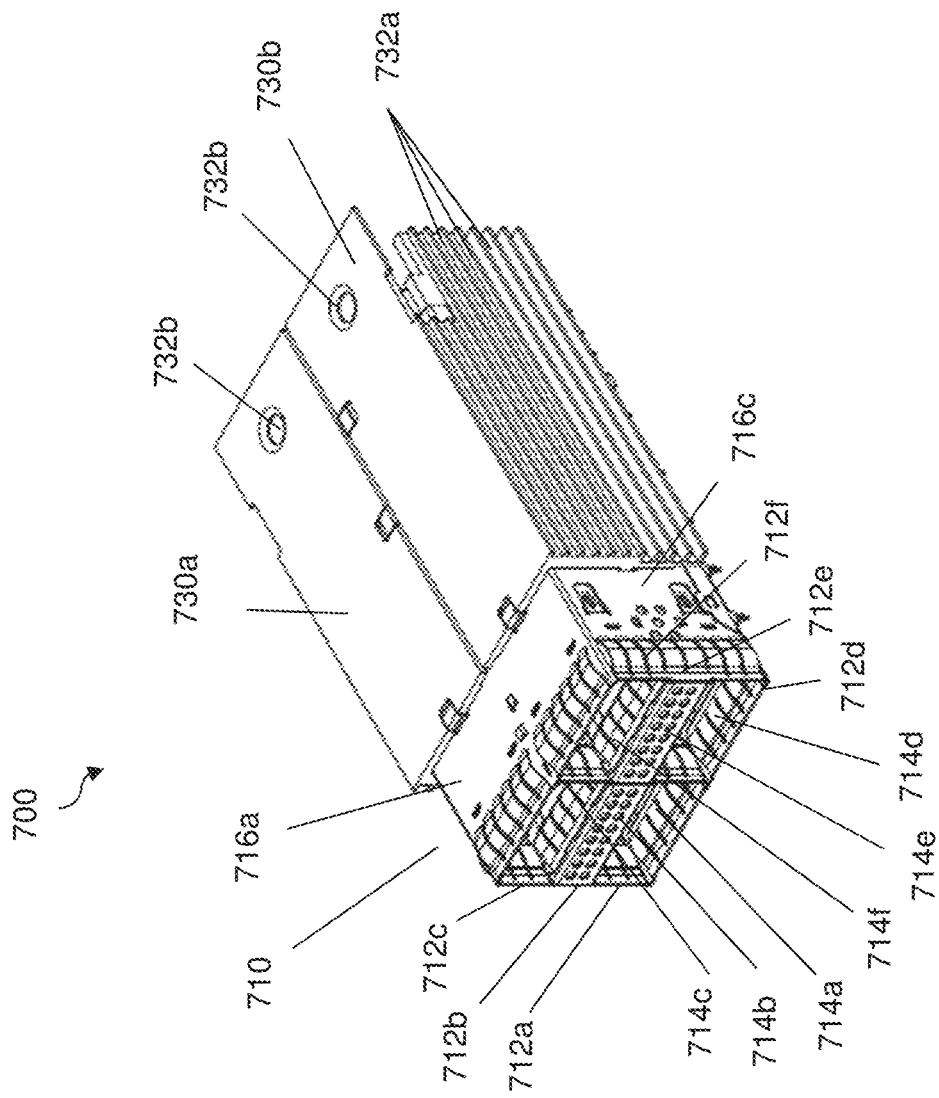
FIG. 10 is a front-right perspective view of a cage with associated thermal management components according to some embodiments.
Figure 11:
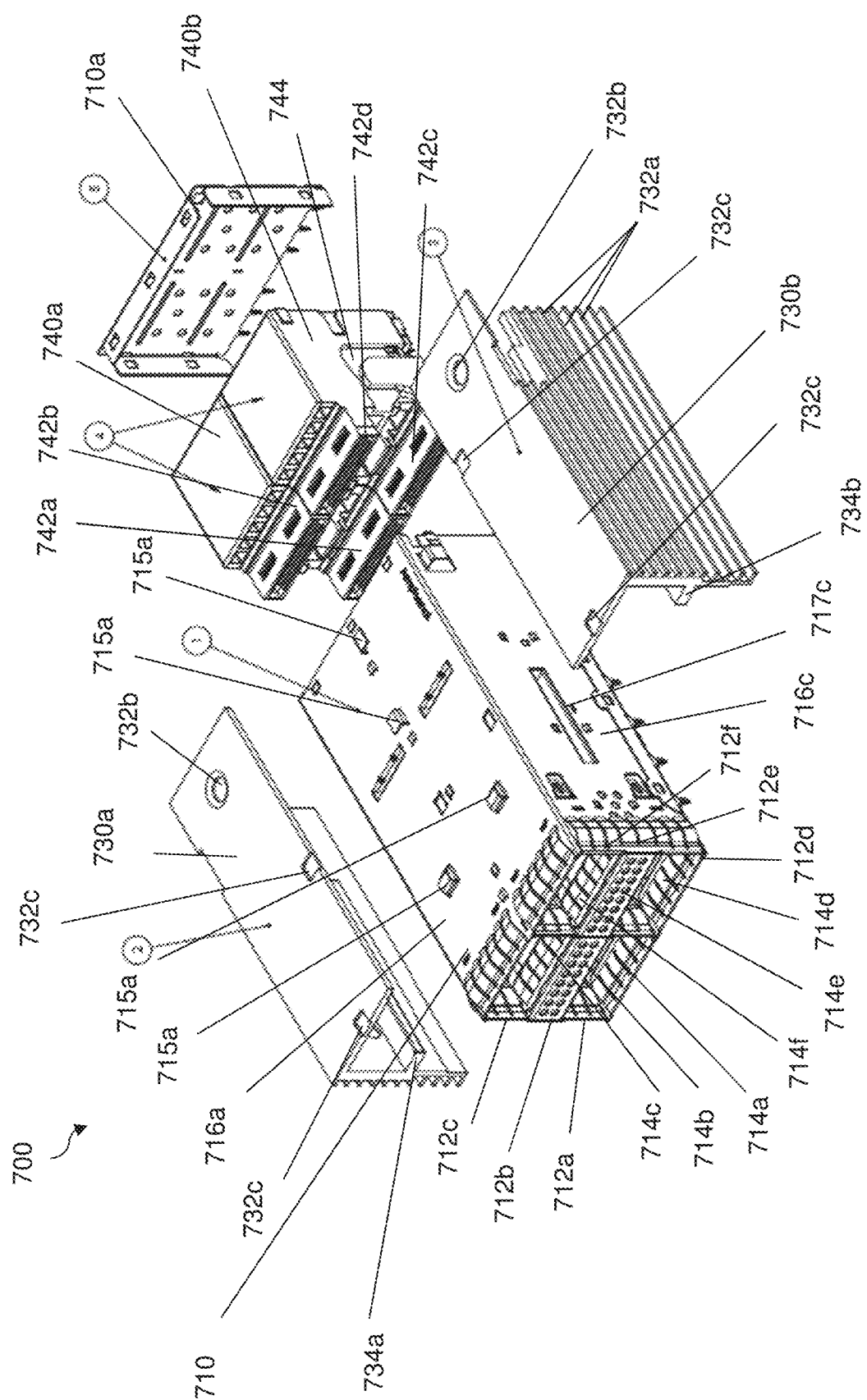
FIG. 11 is a front-right exploded perspective view of the cage of FIG. 10.

FIG. 10 shows a perspective view and FIG. 11 shows an exploded perspective view of one illustrative embodiment of an assembly including an electrical connector in which heat is coupled from one or more transceivers to a heat transfer element inside the cage that is in thermal and mechanical contact with the transceivers. The heat may then be dissipated outside of the cage. In the embodiment illustrated in FIGS. 10-12B, heat is dissipated outside the cage via heat sinks 732 that are thermally coupled to the heat transfer element and to the cage.

In the illustrative embodiment of FIGS. 10 and 11, assembly 700 includes two electrical connectors 740a and 740b in a side-by-side configuration. In the illustrative embodiment, cage 710 differs from cage 310 in that it is a configured for a two by two arrangement of ports. Assembly 700 includes a cage 710. The illustrated assembly 700 further includes heat transfer element 720, heat dissipating elements 730a and 730b, connector 740a. Assembly 700 may be configured to receive transceivers in channels aligned with each of the ports. Those transceivers may be similar to other transceivers described above, with similar power consumption or meeting the same standards.

The cage 710 may be formed using materials and techniques described in connection to cage 310 as described with respect to FIG. 2. For example, cage 710 may be configured to receive similar transceivers and may be formed having similar dimensions (such as height or length) as cage 310. As shown in the illustrated embodiment of FIGS. 10 and 11, the cage 710 differs from the cage 310 in the respect that it includes six channels. The channels of cage 710 may be formed using materials and techniques described in connection to the channels of cage 310 in connection with FIG. 2, for example, being configured to receive similar transceivers and formed having similar dimensions as cage 310. The cage 710 may include a first channel 712a, a second channel 712b, and a third channel 712c. The channels 712a, 712b, and 712c may be stacked using the same techniques of stacking channels 312a, 312b, and 312c, described in connection to FIG. 2.

The cage 710 includes further channels. The cage 710 may include a fourth channel 712*d*, a fifth channel 712*e*, and a sixth channel 712*f*. The channels 712*d*, 712*e*, and 712*f* may be stacked using the same techniques of stacking channels 312*a*, 312*b*, and 312*c*, described in connection to FIG. 2. However, the arrangement of channels of cage 710 differs from the arrangements in the respect that the cage 710 includes six channels arranged in two adjacent vertical stacks including three channels each.

The cage may include a rear cover 710*a*. In the illustrated embodiment, rear cover 710*a* may be formed using materials and techniques as described above in connection with rear cover 310*a* with respect to FIG. 3, or any other suitable way to at least partially surround the connectors with the cage. However, rear cover 710*a* may differ from rear cover 310*a* in the respect that it may not include an opening configured to allow a heat pipe to extend from inside the cage to outside the cage.

The first channel 712*a* may include an opening 714*a*. The second channel 712*b* may include an opening 714*b*. The third channel 712*c* may include an opening 714*c*. The fourth channel 712*d* may include an opening 714*d*. The fifth channel 712*e* may include an opening 714*e*. The sixth channel 712*f* may include an opening 714*f*. The openings of the cage 710 may be formed using techniques as described above in connection with FIG. 2, for example to receive similar transceivers or to have similar dimensions.

The cage 710 may at least partially enclose one or more connectors. In the illustrative embodiment of FIG. 11, the assembly includes a first connector 740*a* and a second connector 740*b*. The first connector 740*a* and the second connector 740*b* may be formed using materials and techniques as described above in connection with FIG. 3. However, in the illustrative embodiment of FIG. 11, the arrangement of the connectors differs from the arrangement in FIG. 3 in that two similar connectors are arranged adjacent or each other to form a two by two arrangement of ports. The connectors in FIG. 11 may also differ from the connectors of FIG. 3 in that the connector channel 744 is formed having a different geometry than connector channel 344. In the illustrated embodiment, channel 744 has a first opening aligned with the first direction and a second opening aligned with the vertical direction. In some embodiments, there may be a single connector formed having four ports. in the illustrative embodiment, the first connector 740*a* includes a first port 742*a* and a second port 724*b*. In the illustrative embodiment, the second connector 740*b* includes a third port 742*c* and a fourth port 742*d*.

The ports may be aligned with channels, and the channels may receive transceivers and/or guide them to mate with the ports. In the illustrated embodiment, the first port 742*a* is aligned with the first channel 712*a*, the second port 742*b* is aligned with the third channel 712*c*, the third port 742*c* is aligned with the fourth channel 712*d*, and the fourth port is aligned with the sixth channel 712*f*. The ports may be formed using techniques as described above in connection with the ports of FIG. 3, for example to mate with similar transceivers.

FIG. 12A shows an exploded perspective view of exemplary cage 710. The cage 710 may be bounded by conductive top walls 716*a*, conductive bottom walls 716*b*, and conductive side walls 716*c*. The cage 710 may include opposing conductive side walls 316*c* with a top wall 316*a* between the opposing side walls. The bottom wall 716*b* may serve as the bottom wall of first channel 712*a* and fourth channel 712*d*. Top wall 716*a* may serve as the top wall for the third channel 712*c* and sixth channel 712*f*. Walls 716*a*, 716*b*, and 716*c* may be formed using materials and techniques as described above in connection with the walls of cage 310 described with respect to FIG. 2. For example, the walls may constructed to receive similar transceivers or having similar dimensions (such as height and length). One or more wall pieces may combine to provide shielding. A heat sink may contribute to shielding.

In some embodiments, the cage 710 may further comprise a middle cage 750. The middle cage 750 may include various structures and may form partitions which are internal to the cage 710. The middle cage may form horizontal partitions and vertical partitions which are internal to cage 710. The internal partitions may form the top, bottom, and side walls of second channel 712*b* and fifth channel 712*e*. In some embodiments, the horizontal internal partitions 716*d* may have openings. Horizontal and/or vertical internal partitions may have openings which may allow heat and/or air to flow between channels.

In the illustrative embodiment, the cage 710 includes elements 718, disposed in the second channel 712*b* and the fifth channel 712*e*. In the illustrative embodiment of FIG. 12A, elements 718 include openings 719 which align with the opening 714*b* of the second channel 712*b* and the opening 714*e* of fifth channel 712*e* as well as the openings 758 of the middle cages.

Figure 12B:
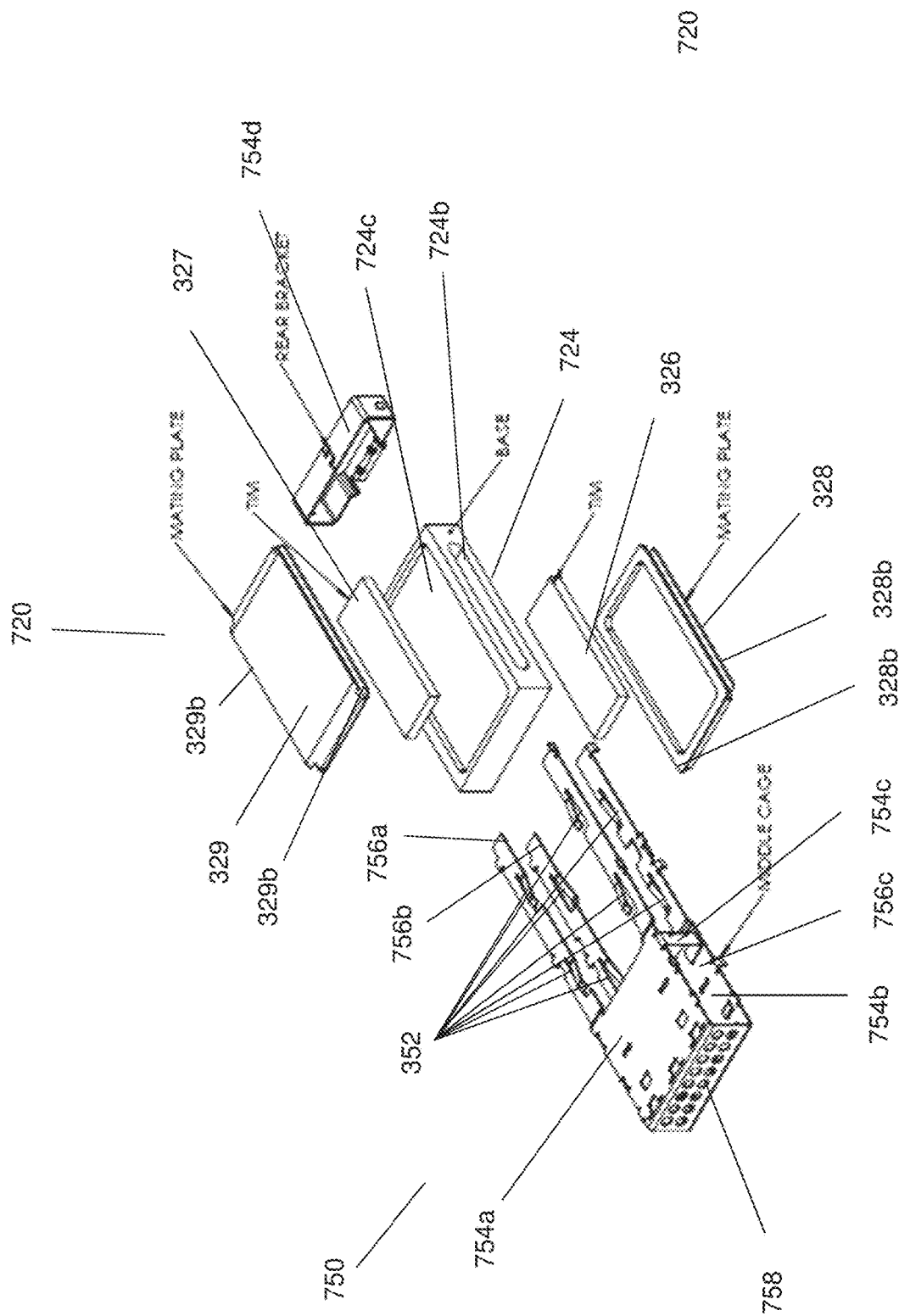
FIG. 12B is a front-right exploded perspective view of a middle cage and associated thermal management components according to some embodiments.

As shown in FIGS. 12A and 12B, the assembly 700 may include one or more heat transfer elements 720. In some embodiments, there may be two or more heat transfer elements arranged adjacent to each other as shown in FIG. 12A. Heat transfer element 720 may be formed using materials and techniques as described above in connection with heat transfer element 320 with respect to FIG. 5A and may receive heat from transceivers inside the cage. Similar to heat transfer element 320, each heat transfer element 720 may comprise at least one compressible portion, with a pad 326, and a plate 328. Likewise, the heat transfer element may be coupled to the internal partitions 716*c* and 716*d* of the cage and/or may be held in the second channel 712*b* by the internal partitions.

The base 724 may include a cavity constructed and arranged such that the pad 326 may be inserted into the base. In some embodiments, the cavity 724*a* may be a first cavity, the pad 326 may be a first pad, and the plate 328 may be a first plate. In such embodiments, the heat transfer element 720 may include a compressible portion which is a second compressible portion. The second compressible portion may include a second pad 327 and a second plate 329. The base 722 may include a second cavity 724*c* which is constructed such that the second pad 327 may be inset in the base 724. The second cavity 724*c*, second pad 327, and second plate 329 may be arranged on the second side of the base, the second side being opposite the first side of the base.

Heat transfer element 720 may differ from the heat transfer element in the respect that it does not include a heat pipe. In contrast to base 324, base 724 may be coupled to a heat dissipating element without a heat pipe. As shown in FIG. 12B, the heat transfer element 720 may include a base 724. The base 724 may be formed using materials and techniques as described above in connection with base 324 with respect to FIG. 5A.

Base 724 may differ from base 324 in the respect that it may be coupled to a heat dissipating element without a heat pipe. The base 724 may include one or more channels, of which channel 724*b* is visible, configured such that a portion of a heat dissipating element may be inset into the channel and mechanically and/or thermally coupled to the heat transfer element such that heat may be transferred to the heat dissipating element.

The conductive side walls 716c may include one or more openings 717c therethrough. The openings 717c may be arranged extending along the second channel 712b. Here, openings 717c are shaped as slots, elongated in a direction parallel to the elongated dimension of the channels. The openings 717c may allow an element to extend from outside the cage to inside of the cage or vice versa. For example, in the illustrative embodiment of FIGS. 10 and 11, the portion 734a of heat dissipating element 730a and the portion 734b of heat dissipating element 730b are configured to extend through the openings 717c of the cage.

As shown in FIG. 12A, the cage 710 may include at least one middle cage 750, for example, two middle cages 750 arranged side by side in the second channel 712b and the fifth channel 712e. In the illustrated embodiment of FIG. 12B, middle cage 750 may be formed using materials and techniques as described above in connection with middle cage 350 with respect to FIG. 6A. In the embodiment illustrated in FIG. 12A, however, middle cage 750 differs from middle cage 350 in that at least one of its sidewalls contains sufficient openings that connections may be made to a heat transfer element within the middle cage through the sidewall. A middle cage 750 disposed in the second channel 712b may be configured such that a heat transfer element, for example, heat transfer element 720, having a first and a second compressible portion, may contact a transceiver disposed in either or both of the first or the third channels.

The middle cage 750 may include at least one top wall 754a, at least one bottom wall 754b, and at least one side wall 754c. Side wall 754c may differ from sidewall 354c in that it occupies a smaller area than sidewall 354c. The middle cage 750 may include at least one opening 756a, 756b, and/or 756c respectively through the at least one top wall 754a, at least one bottom wall 754b, and at least one side wall 754c. The openings 756c may differ from openings 356c in that they occupy greater area than openings 356c and are larger than openings 356c. The middle cage 750 may include at least one biasing element. In the embodiment of FIG. 12B, the middle cage includes eight spring fingers 352, four facing each adjacent channel. The middle cage 750 may include at least one front opening 758, which may enable air flow in the middle cage.

A middle cage may include a rear portion, which may be integrally formed with other portions of the middle cage or separately formed and then attached to other portions of the middle cage. In some embodiments, the rear portion may be a rear bracket. In the illustrative embodiment of FIGS. 12A and 12B, the middle cage 750 includes a rear portion 754d. The rear portion 754d may be a bracket configured to be support top walls 754a and bottom walls 754b. The bracket also may be configured for other purposes, such as to hold a heat transfer element in the middle cage. In the illustrative embodiment, the rear portion 754d is configured as a separate part from the middle cage 750.

In some embodiments, assemblies may include one or more heat dissipating elements. In the illustrated embodiment of FIGS. 10 and 11, the assembly 700 includes a first heat dissipating element 730a and a second heat dissipating element 730b. In the illustrated embodiments, heat dissipating elements 730a and 730b operate as heat sinks. Heat sinks may include fins, for example, fins 732a. Air flowing over the heatsinks may carry heat away from the assembly.

The heat dissipating elements 730a and 730b may include portions 734a and 734b that facilitate heat flow to the heat dissipating elements. In the illustrated embodiment, the portions 734a and 734b are projections that align with the middle channel. Those projections extend through the openings 717c in the cage 710 so as to mechanically engage the heat transfer element. Portions 734a and 734b may interface to the heat transfer element so as to provide good thermal contact. For example, the projections may mechanically or thermally couple with the channels 724b of the base 724. The projections may have a suitable size relative to the channels 724b such that a secure mechanical and therefore thermal connection may be made, for example, by interference-fit or by an adhesive material.

The portions 734a and 734b may be metal or made of other material of low thermal resistance such that heat flows from the heat transfer element 720 to the heat dissipating element 730. From there, heat may be dissipated from the heat dissipating element. The portions 734a and 734b may sufficiently conduct heat that heat transfer element 720 can coupled to the heat dissipating element without a heat pipe. It should be appreciated, however, that other mechanisms, including a heat pipe, to transfer heat to a heat dissipating element mounted to a wall of a cage may alternatively or additionally be used.

In some embodiments, a heat dissipating element may be attached to the cage 710. For example, in the embodiment of FIGS. 10 and 11, the first heat dissipating element 730a and second heat dissipating element 730b include cavities 732c that receive coupling elements that attach the heat dissipating elements to the cage. In the illustrated embodiment, the cage 710 includes coupling element 715a, which may be stamped from the same sheet of metal as the cage. Here, the coupling elements 715a are tabs cut out the top wall of cage 710. In some embodiments, coupling elements may comprise clips or springs.

In some embodiments, heat dissipating elements may be or may be coupled to a cold plate or other heat dissipating element. For example, openings 732b may receive screws attaching a cold plate (not shown) to heat dissipating elements 730a and 730b by coupling or biasing elements such as a screw, spring, or clip which may be inserted at least partially through the openings.

Figure 13:
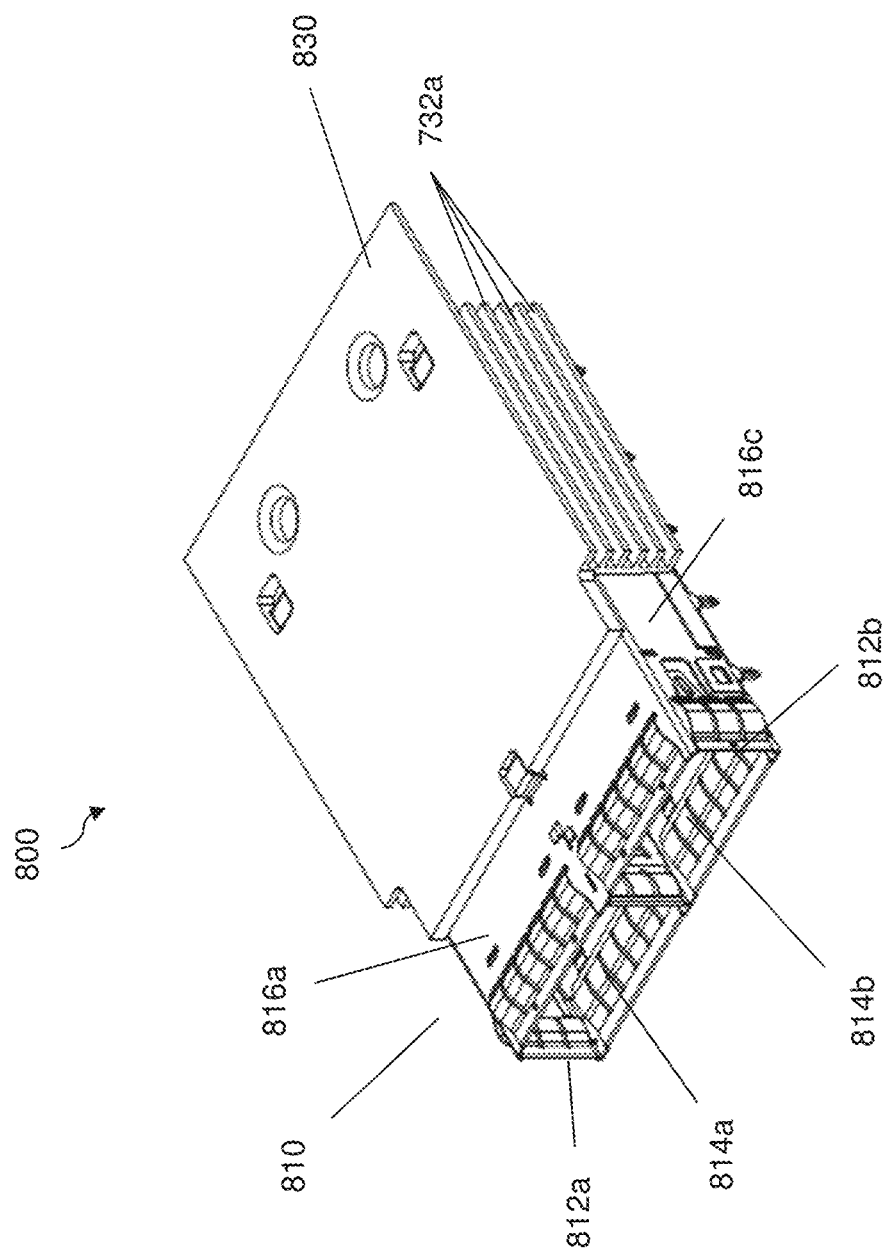
FIG. 13 is a front-right perspective view of a cage with associated thermal management components according to some embodiments.
Figure 14:
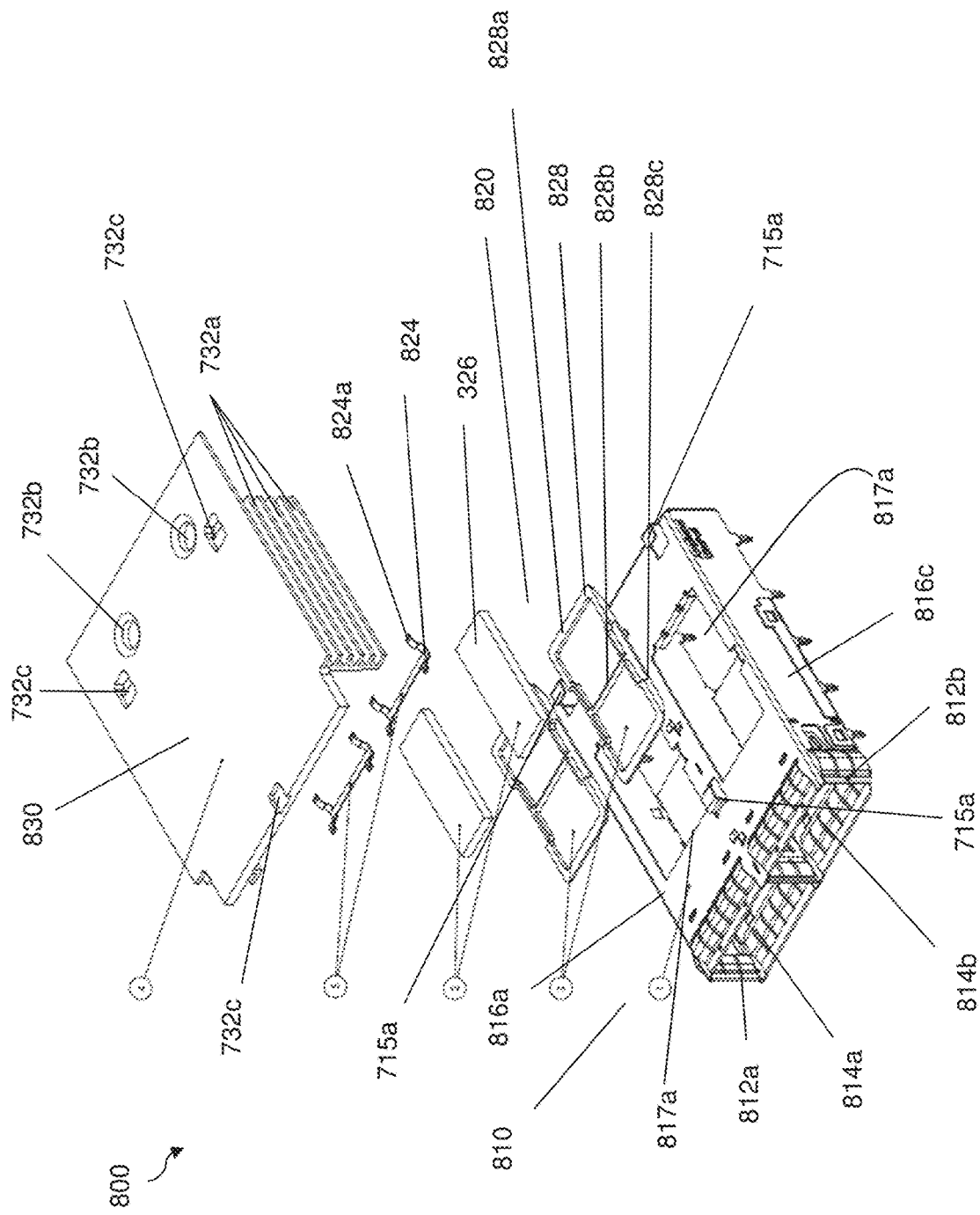
FIG. 14 is a front-right exploded perspective view of the cage of FIG. 13.

FIG. 13 shows a perspective view and FIG. 14 shows an exploded perspective view of an illustrative embodiment of an assembly. FIG. 14 illustrates an assembly 800 including an electrical connector. Assembly 800 includes a cage 810, which is a configured for a one by two arrangement of connectors. Assembly 800 further includes heat transfer element 820, heat dissipating element 830, and connector 840. Assembly 800 may be configured to receive transceivers which are similar to other transceivers described herein.

The cage 810 may be formed using materials and techniques described in connection to cage 310 as described with respect to FIG. 2. For example, cage 810 may be configured to receive similar transceivers and may be formed having similar dimensions as cage 310. Cage 810 may differ from cage 310 in the respect that it includes two channels, a first channel 812a and a second channel 812b. The channels of cage 810 may be formed using materials and techniques described in connection to the channels of cage 310 in connection with FIG. 2, for example, being configured to receive similar transceivers and formed having similar dimensions as cage 810. The first and second channels may be arranged adjacent horizontally with respect to a surface of a printed circuit board (not shown) to which the cage is mounted.

The first channel 812a may include an opening 814a and the second channel 812b may include an opening 814b. The openings of the cage 810 may be formed using techniques as described above in connection with FIG. 2, for example to receive similar transceivers or to have similar dimensions.

The cage 810 may at least partially enclose at least one connector. Here, two connectors may be used to provide two ports, arranged one by two. The ports may be formed using techniques as described above in connection with the ports of FIG. 3, for example to mate with similar transceivers.

The ports may be aligned with channels, and the channels may receive transceivers and/or guide them to mate with the ports. In the illustrated embodiment, the first port 842*a* is aligned with the first channel 812*a*, the second port 842*b* is aligned with the third channel 812*c*, The cage 810 may be bounded by conductive top walls 816*a*, conductive bottom walls 816*b*, and conductive side walls 816*c*. The cage 810 may include opposing conductive side walls 816*c* with a top wall 816*a* between the opposing side walls. The bottom wall 816*b* may serve as the bottom wall of first channel 812*a* and second channel 812*b*. Top wall 816*a* may serve as the top wall for the first channel 812*a* and second channel 812*b*. Walls 816*a*, 816*b*, and 816*c* may be formed using materials and techniques as described above in connection with the walls of cage 310 described with respect to FIG. 2. For example, the walls may constructed to receive similar transceivers or having similar dimensions (such as length). One or more wall pieces may combine to provide shielding.

The cage 810 may include internal partitions. Partitions 816*d* which are internal to cage 810 may form the side walls of first channel 812*a* and second channel 812*b*. In some embodiments, the internal partitions 816*e* may include openings therethrough, which may allow heat and/or air to flow between channels.

In some embodiments, a heat dissipating element may be coupled to the cage 810. In the illustrated embodiment of FIGS. 13 and 14, the heat dissipating element 830*a* include cavities 732*c* for attaching it to cage 810. In the illustrated embodiment, the cage 810 includes coupling elements 715*a*. Coupling elements 715*a* may be coupled to the cavities 732*c* of the heat dissipating element to couple the heat dissipating element to the cage.

The conductive top walls 816*a* of cage 810 may include one or more openings 817*a* therethrough. The holes 817*a* may allow an element to extend from inside the cage to outside the cage (described below). In some embodiments, the holes 817*a* may allow an element outside the cage to contact a transceiver disposed within the cage. That element may be a heat transfer element that transfers heat from a transceiver inside the cage to a heat dissipating element outside the cage. In the illustrated embodiment, heat transfer element 820 may be disposed through the opening 817*a* in the top of the cage 810 and may contact a transceiver disposed within the first channel 812*a* or second channel 812*b*. In some embodiments, there may be one or more heat transfer elements arranged adjacent to each other.

The heat transfer element 820 may comprise a compressible portion. The compressible portion may comprise a biasing element 824. The compressible portion may further comprise a plate 828. The plate 828 may include portions 828*c* extending from the sides of plate 828 that may press against the top walls 816*a* when plate 828 is partially inserted into hole 817*a*. The compressible portion may further comprise a pad 326, thermally coupling plate 828 to heat dissipation element 830.

Biasing elements 824 may function like spring fingers 352 described with respect to FIG. 6A. For example, the biasing elements may constructed to urge plate 828 into contact with a transceiver disposed in an adjacent channel. However, the biasing element 824 may differ from spring fingers 352 in that the biasing element 824 is not stamped from the same sheet of metal as is used to make the cage. Rather, biasing element 824 may be formed as a separate component and attached to the assembly.

Biasing element 824 may be made of metal or other material selected based on material properties, such as springiness. The biasing element 824 may comprise at least one spring. Here, the biasing element 824 has spring fingers 824*a*. In some embodiments, the biasing element may be configured to deflect in response to an applied force so as to apply a counter force.

Plate 828 may include a cavity 828*a* which allows a pad 326 to be inset therein. In some embodiments, plate 828 may include a channel 828*b*, which may be disposed in the cavity 828*a* and may be configured to receive the biasing element 824. When heat dissipating element is secured to cage 810 biasing element 824 will be compressed between plate 828 and head dissipating element 830, urging a portion of plate 828 into a channel, if there is no transceiver installed in the channel. Plate 828 will be retained by portions 828*c* pressing against the top wall of the cage. Pad 326 will be selected to have sufficient thickness and travel that, in this configuration, pad 326 contacts both plate 828 and heat dissipation element 830.

When a transceiver is inserted, the transceiver may push the portions of plate 828 in the channel back towards heat dissipation element 830. Pad 326 such that the amount by which plate 828 moves is less than the travel of the pad. In this way, thermal contact is maintained between plate 828 and heat dissipation element 830 over the full range of travel and the thermal contact is provided between the transceiver and heat dissipation element 830.

In the illustrated embodiment of FIG. 14, the cage includes a one by two arrangement of channels. The heat transfer elements 820 are facing the top wall of the first channel 812*a* and second channel 812*b*. The application is not limited in this respect, and the heat transfer elements may face any wall of the channels, whether top, bottom, side or internal walls. In some embodiments, there may be a different arrangement of channels, for examples, a two by two arrangement of channels.

In some embodiments, assemblies may include one or more heat dissipating elements. In the illustrated embodiment of FIGS. 13 and 14, the assembly 800 includes a heat dissipating element 830. The heat dissipating element 830 may be formed using techniques as described above in connection with heat dissipation elements of FIGS. 10 and 11. In some embodiments, the heat dissipating element 830 may be heat sinks. Heat sinks may include fins 732*a*.

In some embodiments, heat dissipating elements may be or include cold plates. In some embodiments, the heat dissipating element 830 may be coupled to a cold plate. In some embodiments, heat dissipating elements may include an opening 732*b* therethrough. Heat dissipating elements may be coupled with a cold plate using the openings 732*b* such that a cold plate may be screwed or otherwise attached to the heat dissipating element.

According to aspects of the present application, an assembly including a connector may comprise other components arranged and constructed to increase heat transfer, for example, other thermal interface materials. In some embodiments, the components may comprise adhesive or compressible components configured to increase heat transfer. In some embodiments, the components may comprise thermal tape configured to increase heat transfer. In some embodiments, thermal tape may be placed on any of the metal parts of the assembly. For example, thermal tape may be placed on a transceiver disposed in a channel of a cage or on a plate of a heat transfer element.

In some embodiments, thermal tape may be a compressible or soft material. The thermal tape may have a low elastic modulus. In some embodiments, thermal tape may be arranged with a small thickness, for example from substantially 0.1 mm to substantially 0.15 mm. Thermal tape being soft or having a low elastic modulus may provide more points of contact and/or a larger contact area, which may enhance heat transfer from a transceiver. In some embodiments, thermal tape may have a thermal conductivity from substantially 0.2 W/m·K to substantially 1.0 W/m·K, for example 0.6 W/m·K.

A configuration of a heat transfer element and/or a heat dissipating element as described herein may enable sufficient heat transfer to dissipate heat from the one or more transceivers disposed in channels of a cage to keep even a relatively dense transceiver configuration within tolerable temperature limits. In some embodiments which include a heat sink as a heat dissipating element, heat dissipation may be possible without a large fan, which might draw undesirable amounts of power. In various embodiments, a fan may be configured to cause a static pressure less than 0.8 inches of water (IW), less than 1.5 IW, or, in some embodiments, between 0.8 and 1.5 IW, for example 1.0 IW. Some embodiments may include a heat plate for heat dissipation.

A system according to the present application may provide a desirable method of operation for an electronic system, such as electronic system 100. The electronic system 100 may be disposed in an ambient environment of 25 degrees C. The electronic system 100 may include an enclosure 120. An assembly 200 including an electrical connector may be disposed within the enclosure 120. The assembly 200 may include a cage 210 which may include a first channel, a second channel and a third channel. The channels may be formed along a first direction. In some embodiments, there may be a port aligned with the first channel. The channels may be formed from a plurality of walls.

The method according to the embodiment includes transmitting and/or receiving optical signals with a transceiver disposed within the first channel, and may further include transmitting and/or receiving optical signals with one or more transceivers disposed within one or more other channels of the cage 210. In some embodiments, each transceiver disposed in the first channel and other channels may consume at least 1 W, less than 15 W, or, in some embodiments, between 1 and 15 W. In some embodiments, the transceivers may consume 1.5 W, 3.5 W, 7 W, 8 W, 10 W, 12 W, 14 W, or greater than 14 W, for example, 16 W. In some high power embodiments, the transceivers may consume between 10 and 16 W. Such power dissipation is consistent with a QSFP-DD transceiver.

The method according to the embodiment includes contacting the transceiver by a heat transfer element, transferring heat from inside the cage to outside the cage by the heat transfer element, and dissipating heat from a heat dissipating element thermally coupled to the heat transfer element, thereby dissipating heat from the transceiver in the first channel such that a temperature rise of the transceiver relative to an off state of the transceiver is less than 25 degrees C. In some embodiments, the heat dissipating element may be a heat sink or a cold plate.

In some embodiments which include a heat sink, the system may further include a fan. In such embodiments the method may further include flowing air over the heat sink by a fan 130 disposed within the enclosure 120. The fan 130 may be operating at a static pressure of at least 0.8 inches of water (IW), less than 1.5 IW, or between 0.8 and 1.5 IW, for example, 1.0 IW.

Heat is dissipated from the transceivers disposed in the cage 210 such that a temperature rise of both transceivers relative to an off state of the transceivers is less than 25 degrees C. With such a configuration, the heat dissipated from within the cage may be sufficient that this temperature rise may be achieved even with the electronic enclosure in an ambient environment of 25 degrees C.

It should be understood that aspects of the disclosure are described herein with reference to certain illustrative embodiments and the figures. The illustrative embodiments described herein are not necessarily intended to show all aspects of the disclosure, but rather are used to describe a few illustrative embodiments. Thus, aspects of the disclosure are not intended to be construed narrowly in view of the illustrative embodiments. In addition, it should be understood that aspects of the disclosure may be used alone or in any suitable combination with other aspects of the disclosure.

Various changes may be made to the illustrative structures shown and described herein. For example, according to some embodiments, a fan may be positioned to cause air to flow over or through a cage and/or a heat dissipating element of the present application. For example, as shown in FIG. 1, fan 130 may be positioned to exhaust air from enclosure 120. FIG. 1 shows fan 130 schematically adjacent a wall of enclosure 120, but fan 130 may be positioned in any suitable location. Fan 130, for example, may be positioned inside enclosure 120. In some embodiments, such as in rack mounted electronic devices, I/O connectors are exposed in a front face of the enclosure 120, and one or more fans exhaust air from an opposite, rear face of the enclosure. However, it will be appreciated that other suitable locations may create a pressure drop that causes air to flow over components within an electronic enclosure. In some embodiments, a fan may cause air to flow along the first direction. In some embodiments, a fan may cause air to flow in a different direction, for example, along a horizontal direction perpendicular to the first direction.

Moreover, the techniques described herein may be used in combination. For example, FIG. 14 illustrates heat transferred to a heat dissipation element through a compressible portion attached to the heat dissipation element. FIG. 11 shows contact between a projection of a heat dissipation element and a heat transfer element in a cage. These techniques could be used together, for example, to transfer heat from a transceiver to a heat dissipation element.

As another example, FIG. 15 shows multiple heat pipes exiting a ganged cage. The heat pipes, or other heat transfer elements from a ganged cage, may be connected to a heat dissipation element, including those as described in connection with FIGS. 7-9.

For purposes of this patent application and any patent issuing thereon, the indefinite articles "a" and "an," as used herein in the specification and in the claims, unless clearly indicated to the contrary, should be understood to mean "at least one." The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified.

The use of "including," "comprising," "having," "containing," "involving," and/or variations thereof herein, is meant to encompass the items listed thereafter and equivalents thereof as well as additional items.

It should also be understood that, unless clearly indicated to the contrary, in any methods claimed herein that include more than one step or act, the order of the steps or acts of the method is not necessarily limited to the order in which the steps or acts of the method are recited.

The foregoing description of various embodiments are intended merely to be illustrative thereof and that other embodiments, modifications, and equivalents are within the scope of the invention recited in the claims appended hereto.

For example, embodiments are described in which connections between a transceiver and a connector are electrical. Embodiments are possible in which the connections are optical.

What is claimed is:

1. Apparatus comprising:
a cage comprising a first channel comprising a first opening configured to receive a transceiver;
a connector comprising a port aligned with the first channel;
a heat transfer element comprising a compressible portion configured to make mechanical and thermal contact with the transceiver inside the first channel; and
at least one biasing element configured to expand the compressible portion, wherein:
the heat transfer element comprises a base;
the compressible portion comprises a thermally conductive plate and a thermal pad coupling the base with the plate;
the at least one biasing element is configured to bias the plate away from the base; and
the thermal pad is configured to expand in response to the biasing.

2. The apparatus of claim 1, wherein the compressible portion has a travel of between 10% and 25%.

3. The apparatus of claim 1, wherein the compressible portion has a travel of between 0.1 and 0.5 mm.

4. The apparatus of claim 1, wherein the compressible portion has a travel of at least 0.2 mm.

5. The apparatus of claim 1, wherein the compressible portion has a thermal conductivity greater than 1 W/m·K.

6. The apparatus of claim 1, wherein the compressible portion has a thermal conductivity between 2 and 8 W/m·K.

7. The apparatus of claim 1, wherein the compressible portion comprises a thermal tape having a thickness between substantially 0.1 mm and substantially 0.15 mm.

8. The apparatus of claim 1, wherein the compressible portion comprises a thermal tape having a thermal conductivity between substantially 0.2 W/m·K to substantially 1.0 W/m·K.

9. The apparatus of claim 1, wherein:
the thermal pad comprises a first surface;
the thermally conductive plate contacts the first surface of the thermal pad; and
the at least one biasing element biases the thermally conductive plate into the first channel such that it is positioned to contact the transceiver when the transceiver is inserted in the first channel.

10. The apparatus of claim 9, wherein:
the at least one biasing element comprises at least one spring finger;
the cage further comprises a second channel adjacent the first channel;
the cage comprises a wall between the first channel and the second channel; and
the at least one spring finger is formed in the wall between the first channel from the second channel.

11. The apparatus of claim 1 wherein:
the cage further comprises a second channel and a third channel;
the third channel comprises a third opening configured to receive a transceiver;
the connector comprises a second port aligned with the third channel;
the second channel is disposed between the first channel and the third channel; and
the heat transfer element comprises:
the thermal pad comprises a first thermal pad configured to expand into the first channel such that the heat transfer element contacts a removable transceiver inserted into the first channel; and
a second thermal pad configured to expand into the third channel such that the heat transfer element contacts a removable transceiver inserted into the third channel.

12. A cage for an I/O connector, the cage comprising:
a first channel;
a second channel adjacent the first channel;
a third channel adjacent the second channel, wherein the second channel is disposed between the first channel and the third channel;
a rail configured to receive a heat transfer element inserted in the second channel;
a spring finger cut from the rail:
positioned with respect to the second channel so as to urge at least a portion of the heat transfer element disposed within the second channel towards the first channel; and
configured to expand a first compressible portion of the heat transfer element.

13. The cage of claim 12 wherein the portion of the heat transfer element is a first portion, and the spring finger is a first spring finger, and
the cage further comprises a second spring finger:
positioned with respect to the second channel so as to urge at least a second portion of the heat transfer element towards the third channel; and
configured to expand a second compressible portion of the heat transfer element.

14. The cage of claim 12, wherein the spring finger has a travel of at least 0.2 mm.

15. A method of operating, in an ambient environment of 25 degrees C., an interconnection system comprising a first channel adjacent a printed circuit board, a third channel a second channel between the first channel and the third channel, and a heat transfer element with a first portion disposed within the second channel and a second portion extending into the first channel, the method comprising:
inserting a transceiver in the first channel, whereby the transceiver contacts the second portion of the heat transfer element and compresses a compressible member of the heat transfer element;
operating the transceiver so as to generate heat, comprising transmitting or receiving optical signals with the transceiver and consuming between 10 and 16 W; and
flowing air over the interconnection system using a fan configured to cause a static pressure between 0.8 and 1.5 inches of water (IW) so as to transfer at least a portion of the heat generated by the transceiver into the second channel via the heat transfer element, comprising transferring heat from the transceiver in the first channel such that a temperature rise of the transceiver relative to an off state of the transceiver is less than 25 degrees C.

16. The method of claim 15, further comprising expanding the compressible member using at least one biasing element.

17. The method of claim 16, further comprising removing the transceiver from the first channel, wherein the expanding is in response to the removing.

18. The method of claim 15, further comprising compressing the thickness of the compressible member at least 10% using forces generated by the inserting.

19. The method of claim 15, further comprising compressing the thickness of the compressible member up to 40% using forces generated by the inserting.

\* \* \* \* \*